United States Patent
Kim et al.

(10) Patent No.: US 12,376,285 B2
(45) Date of Patent: Jul. 29, 2025

(54) MEMORY DEVICE

(71) Applicant: Samsung Electronics Co., Ltd., Suwon-si (KR)

(72) Inventors: Hyuncheol Kim, Seoul (KR); Yongseok Kim, Suwon-si (KR); Kyunghwan Lee, Suwon-si (KR); Minjun Lee, Seoul (KR); Daewon Ha, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 445 days.

(21) Appl. No.: 18/054,986

(22) Filed: Nov. 14, 2022

(65) Prior Publication Data
US 2023/0180453 A1 Jun. 8, 2023

(30) Foreign Application Priority Data

Dec. 8, 2021 (KR) .................. 10-2021-0175212

(51) Int. Cl.
*H10B 12/00* (2023.01)
(52) U.S. Cl.
CPC .................................. *H10B 12/20* (2023.02)
(58) Field of Classification Search
CPC ........ H10B 12/20; H10B 43/30; H10B 12/00; H10D 64/685; H10D 30/694; H10D 64/693; H10D 62/151; H10D 30/62; H10D 84/834
See application file for complete search history.

(56) References Cited

U.S. PATENT DOCUMENTS

| | | | |
|---|---|---|---|
| 7,933,143 B2 | 4/2011 | Jin et al. | |
| 10,714,479 B2 | 7/2020 | Cho et al. | |
| 10,886,274 B2 | 1/2021 | Park et al. | |
| 2005/0062088 A1 | 3/2005 | Houston | |
| 2013/0175604 A1* | 7/2013 | Polishchuk | H10D 30/6728 257/E29.309 |
| 2021/0118875 A1 | 4/2021 | Wu et al. | |

FOREIGN PATENT DOCUMENTS

| | | |
|---|---|---|
| KR | 10-1125475 B1 | 3/2012 |
| KR | 10-2032221 B1 | 10/2019 |

OTHER PUBLICATIONS

Taiwanese Office Action dated Oct. 20, 2023 issued in Taiwanese Patent Application No. 111146067.

* cited by examiner

*Primary Examiner* — Wasiul Haider
(74) *Attorney, Agent, or Firm* — Harness, Dickey & Pierce, P.L.C.

(57) ABSTRACT

A memory device is provided. The memory device includes a substrate, a fin structure on the substrate, a gate structure on the fin structure, a first source/drain at one end of the fin structure, and a second source/drain at the other end of the fin structure, wherein the gate structure includes a trap layer, a blocking layer, and a gate electrode layer sequentially stacked on the fin structure, the first source/drain is doped with or has incorporated therein dopants of a first conductivity-type, and the second source/drain is doped with or has incorporated therein dopants of a second conductivity-type dopants that are different from the dopants of the first conductivity-type.

20 Claims, 24 Drawing Sheets

MEMORY DEVICE

CROSS-REFERENCE TO RELATED APPLICATION

This application is based on and claims priority under 35 U.S.C. § 119 to Korean Patent Application No. 10-2021-0175212, filed on Dec. 8, 2021, in the Korean Intellectual Property Office, the disclosure of which is incorporated by reference herein in its entirety.

BACKGROUND

Inventive concepts relate to a memory device. More particularly, inventive concepts relate to a single transistor-dynamic random access memory (1T-DRAM) device, e.g. a 1T-DRAM device without a capacitor.

To meet the demand for miniaturized, multi-functional, and/or high-performance electronic products, high-capacity semiconductor memory devices are required or desired, and an increased degree of integration is required or desired to provide high-capacity semiconductor memory devices. Accordingly, semiconductor memory devices are also required or desired to be highly integrated and/or have large capacity. Among these semiconductor memory devices, DRAM includes a capacitor to store information. However, it is difficult to reduce the size of capacitors, while maintaining memory performance, thus making it difficult to achieve high integration of DRAM. Therefore, 1T DRAM storing information using a transistor, instead of a capacitor, has been proposed.

SUMMARY

Inventive concepts provide a memory device in which an ON current is increased, a memory window is increased, and/or an operating speed is increased.

According to some example embodiments, there is provided a memory device including a substrate, a fin structure on the substrate, a gate structure on the fin structure, a first source/drain at one end of the fin structure, and a second source/drain at another end of the fin structure, wherein the gate structure includes a trap layer, a blocking layer, and a gate electrode layer that are sequentially stacked on the fin structure, the first source/drain has dopants of a first conductivity-type incorporated therein, and the second source/drain has dopants of a second conductivity-type incorporated therein, the dopants of the second conductivity-type different from the dopants of the first conductivity-type.

According to some example embodiments, there is provided a memory device including a substrate, a first fin structure on the substrate, a second fin structure separated from the first pin structure in a first horizontal direction, a first source/drain at one end of the first fin structure and having first conductivity-type dopants incorporated therein, a second source/drain located at another end of the first fin structure and having second conductivity-type dopants incorporated therein, a third source/drain located at one end of the second fin structure and having the first conductivity-type dopants incorporated therein, a fourth source/drain at another end of the second fin structure and having the second conductivity-type dopants incorporated therein, a first gate structure including a first trap layer, a first blocking layer, and a first gate electrode layer that are sequentially stacked on the first fin structure, a second gate structure including a second trap layer, a second blocking layer, and a second gate electrode layer that are sequentially stacked on the second fin structure, a first bit line connected to the first source/drain and the third source/drain, and a first source line connected to the second source/drain and the fourth source/drain.

According to some example embodiments, there is provided a memory device including a silicon substrate, a silicon fin structure on the silicon substrate, a first source/drain at one end of the silicon fin structure and having first conductivity-type dopants incorporated therein, a second source/drain at another end of the silicon fin structure and having second conductivity-type dopants incorporated therein, the dopants of the second conductivity-type different from the dopants of the first conductivity type, a nitride layer on the silicon fin structure, an oxide layer on the nitride layer, and a gate electrode layer on the oxide layer.

BRIEF DESCRIPTION OF THE DRAWINGS

Embodiments of inventive concepts will be more clearly understood from the following detailed description taken in conjunction with the accompanying drawings in which.

DETAILED DESCRIPTION OF VARIOUS EXAMPLE EMBODIMENTS

Figure 1A:
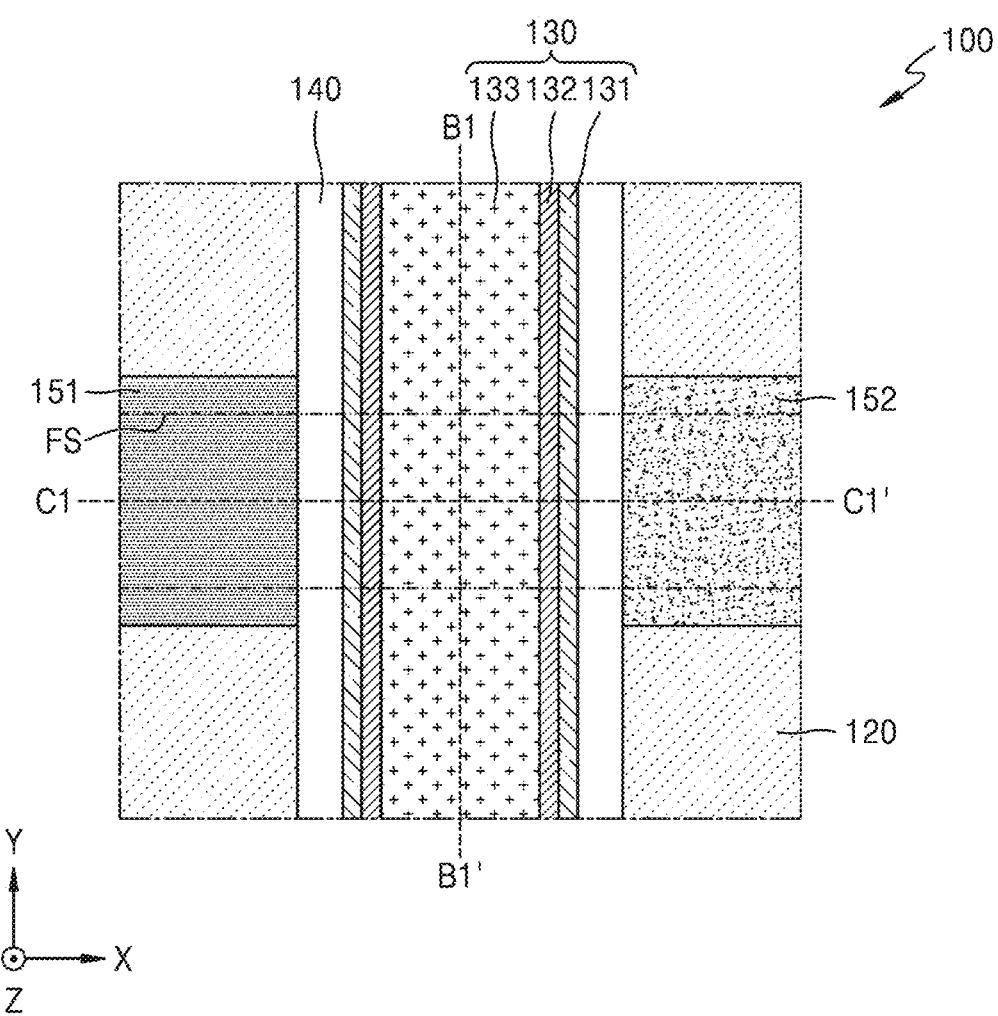
FIG. 1A is a plan view illustrating a memory device according to some example embodiments of inventive concepts.
Figure 1B:
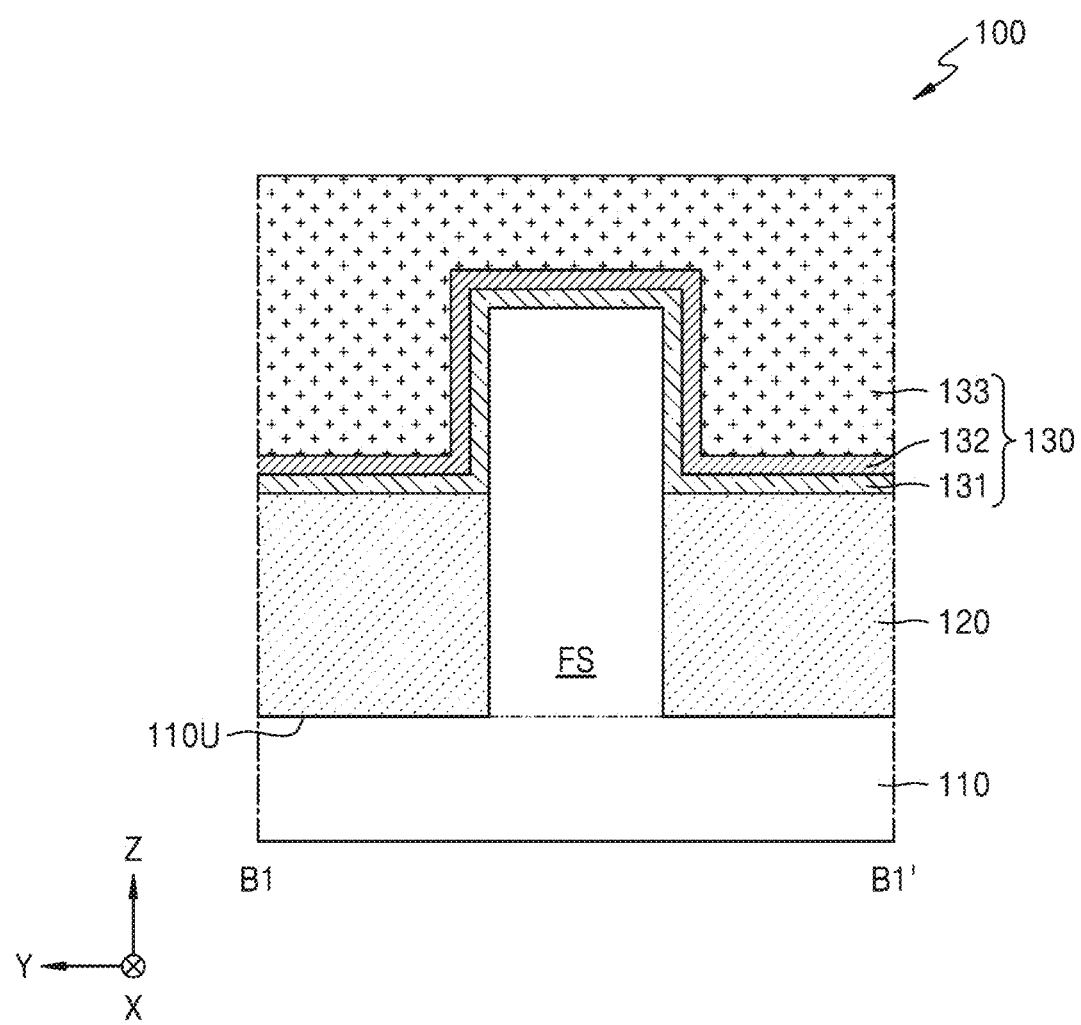
FIG. 1B is a cross-sectional view illustrating a memory device according to some example embodiments of inventive concepts, taken along line B1-B1' of FIG. 1A.
Figure 1C:
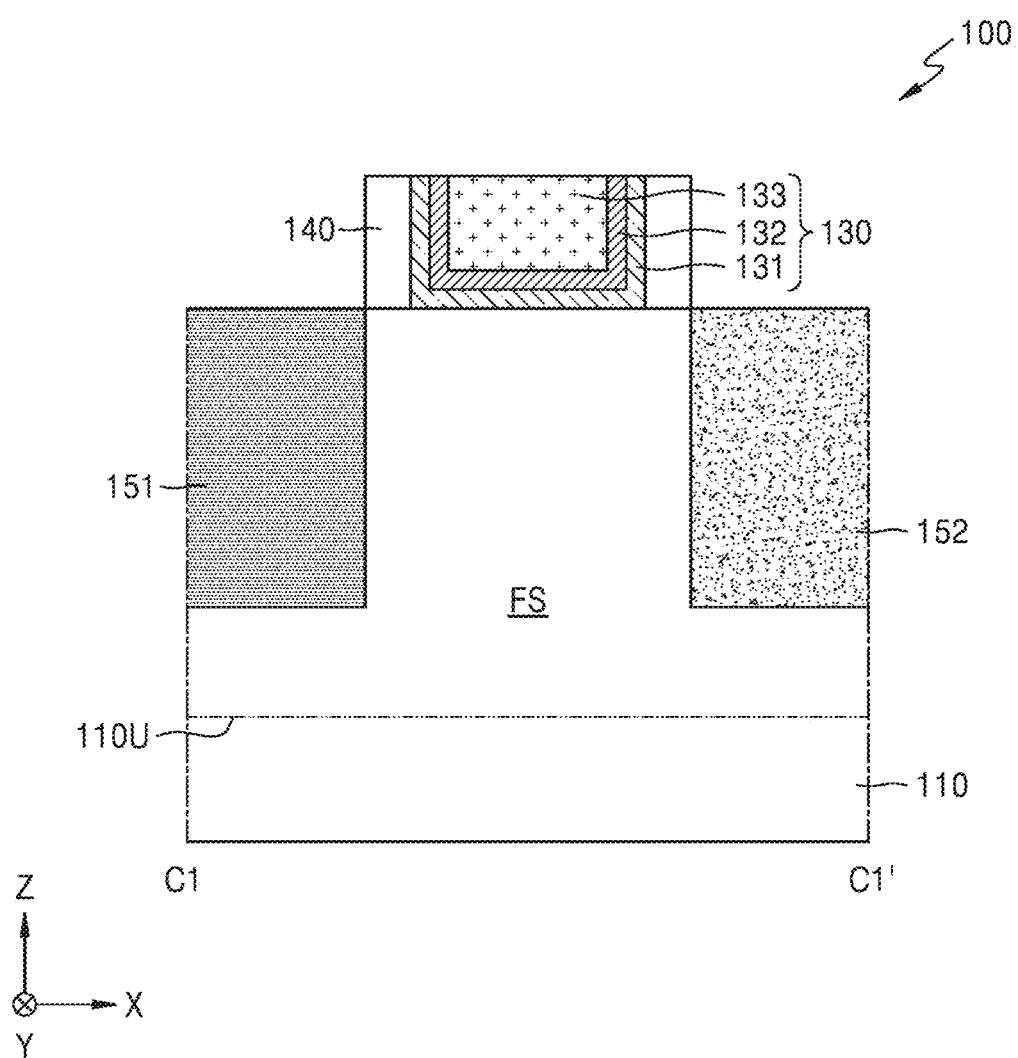
FIG. 1C is a cross-sectional view illustrating a memory device according to some example embodiments of inventive concepts, taken along line C1-C1' of FIG. 1A.

FIG. 1A is a plan view illustrating a memory device 100 according to an example embodiment of inventive concepts. FIG. 1B is a cross-sectional view illustrating the memory device 100 according to some example embodiments of inventive concepts, taken along line B1-B1' of FIG. 1A. FIG. 1C is a cross-sectional view illustrating the memory device 100 according to some example embodiments of inventive concepts, taken along line C1-C1' of FIG. 1A.

Referring to FIGS. 1A to 1C, the memory device 100 may include a substrate 110, a fin structure FS, a gate structure 130, a first source/drain 151, and a second source/drain 152. In some example embodiments, the memory device 100 may further include a device isolation layer 120 and a spacer 140.

The substrate 110 may include a semiconductor material, such as one or more of a group IV semiconductor material, a group III-V semiconductor material, or a group II-VI semiconductor material. The group IV semiconductor material may include, for example, one or more of silicon (Si), germanium (Ge), or silicon (Si)-germanium (Ge). The group III-V semiconductor material may include, for example, one or more of gallium arsenide (GaAs), indium phosphide (InP), gallium phosphide (GaP), indium arsenide (InAs), indium antimonide (InSb), or indium gallium arsenide (InGaAs). The group II-VI semiconductor material may include, for example, one or more of zinc telluride (ZnTe) or cadmium sulfide (CdS). The substrate 110 may have a single-crystal structure; however, example embodiments are not limited thereto. The substrate 110 may be doped, e.g. may be lightly doped with boron; however, example embodiments are not limited thereto.

The fin structure FS may be disposed on the substrate 110. The fin structure FS may protrude over an upper surface 110U of the substrate 110. The fin structure FS may extend in a first horizontal direction (e.g. an X direction). The fin structure FS may include at least one of single crystal silicon, polysilicon, oxide semiconductor, germanium, silicon-germanium, and transition metal dichalcogenide (TMDC). The oxide semiconductor may include, for example, one or more of silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuGaO_2$, $SrCu2O_2$, $SnO_2$, and the like. The TMDC may be expressed, for example, as $MX_2$, where M is a transition metal and X is a chalcogen element. M may include, for example, Mo, W, Nb, V, Ta, Ti, Zr, Hf, Tc, or Re, and X may include, for example, S, Se, or Te. The TMDC material may include, for example, one or more of $MoS_2$, $MoSe_2$, $MoTe_2$, $WS_2$, $WS_2$, $WTe_2$, $ZrS_2$, $ZrSe_2$, $HfS_2$, $HfSe_2$, $NbSe_2$, or $ReSe_2$.

The device isolation layer 120 may be disposed on the substrate 110 and may define the fin structure FS. The device isolation layer 120 may include, for example, at least one of silicon oxide and silicon nitride.

In some example embodiments, the substrate 110 may include the same material as the fin structure FS. For example, the substrate 110 and the fin structure FS may both include silicon (Si). For example, the substrate 110 and the fin structure FS may both include germanium (Ge). For example, the substrate 110 and the fin structure FS may both include silicon (Si)-germanium (Ge). In some example embodiments, the substrate 110 may be integrally formed with the fin structure FS. For example, there may not be a physical boundary between the substrate 110 and the fin structure FS. The fin structure FS may be an epitaxial structure of the substrate 110, for example a heteroepitaxial structure or a homoepitaxial structure; however, example embodiments are not limited thereto.

The gate structure 130 may be disposed on and/or around the fin structure FS. The gate structure 130 may cross the fin structure FS. The gate structure 130 may extend in a second horizontal direction (a Y direction).

The gate structure 130 may include a trap layer 131, a blocking layer 132, and a gate electrode layer 133 that are sequentially stacked on the fin structure FS. In some example embodiments, the gate structure 130 may further include a tunneling insulating layer between the trap layer 131 and the fin structure FS. In some example embodiments, the trap layer 131 may directly contact the fin structure FS. By omitting the tunneling insulating layer, an operating speed of the memory device 100 may be increased.

The trap layer 131 may include at least one of silicon nitride, hafnium oxide, and silicon oxynitride. During a write operation of the memory device 100, charges (such as electrons and/or holes) may be trapped in the trap layer 131, and a read operation of the memory device 100 may be performed by detecting a change in source-drain current due to the trapped charges. An erase operation of the memory device 100 may be performed by removing the trapped charges.

The blocking layer 132 may prevent or reduce the number of charges trapped in the trap layer 131 from escaping to the gate electrode layer 133. The blocking layer 132 may include, for example, at least one of silicon oxide, aluminum oxide, and hexagonal boron nitride.

The gate electrode layer 133 may include, for example, at least one of tungsten, titanium nitride, titanium, ruthenium, molybdenum, nickel, and graphene, and may or may not be doped with other impurities.

The two spacers 140 may be respectively located on both sides of the gate structure 130. The spacer 140 may include at least one of silicon oxide and silicon nitride.

The first source/drain 151 may be located at one end of the fin structure FS, and the second source/drain 152 may be located at the other end of the fin structure FS. The second source/drain 152 may be separated from the first source/drain 151 in the first horizontal direction (the X direction). The first source/drain 151 may include at least one of single crystal silicon, polysilicon, oxide semiconductor, germanium, silicon-germanium, and TMDC. In some example embodiments, the first source/drain 151 and the fin structure FS may include (e.g. may consist of) the same material or materials. The second source/drain 152 may include at least one of single crystal silicon, polysilicon, oxide semiconductor, germanium, silicon-germanium, and TMDC. In some example embodiments, the second source/drain 152 and the fin structure FS may include (e.g. may consist of) the same material or materials.

The first source/drain 151 may be doped with, or have incorporated therein, dopants or impurities of a first conductivity-type, and the second source/drain 152 may be doped with, or have incorporated therein, dopants or impurities of a second conductivity-type that is a different conductivity-type from the first conductivity-type dopants. For example, the first source/drain 151 may be doped with N-type dopants, and the second source/drain 152 may be doped with P-type dopants. Conversely, the first source/drain 151 may be doped with P-type dopants, and the second source/drain 152 may be doped with N-type dopants. The P-type dopants may include, for example, at least one of boron (B), aluminum (Al), indium (In), and gallium (Ga). The N-type dopants may include, for example, at least one of phosphorus (P), arsenic (As), antimony (Sb), and bismuth (Bi). Because the first source/drain 151 is doped with the first conductivity-type dopants, and the second source/drain 152 is doped with the second conductivity-type dopants that are different from the first conductivity-type dopants, holes and electrons may be more smoothly supplied into the trap layer 131. Accordingly, the operating speed of the memory device 100 may be increased.

In some example embodiments, a majority carrier in the first source/drain 151 may be electrons, while a majority carrier in the second source/drain may be holes. In some example embodiments, the second source/drain 152 may be lightly counter-doped with impurities of the first conductivity-type, and/or the first source/drain 151 may be lightly counter-doped with impurities of the second conductivity-type. In some example embodiments, within the first source/drain 151 an impurity dopant concentration of dopants of the first conductivity-type may be an order of magnitude or more, e.g., hundreds to millions times more, than the impurity dopant concentration of dopants of the second conductivity-type. Similarly in some example embodiments, within the second source/drain 152 an impurity dopant concentration of dopants of the second conductivity-type may be an order of magnitude or more, e.g., hundreds to millions times more, than the impurity dopant concentration of dopants of the first conductivity-type. However, example embodiments are not limited thereto. The impurity dopant concentrations may be assessed, for example, with a secondary ion mass spectrometry (SIMS) technique such as a time-of-flight SIMS (TOF-SIMS) technique; however, example embodiments are not limited thereto.

The memory device 100 according to some example embodiments of inventive concepts includes a fin-type charge trap transistor. According to some example embodiments of inventive concepts, an electric field may be increased due to the fin structure FS, so that an ON current may be increased and a memory window may be increased, compared with a planar charge trap transistor.

FIGS. 2A, 3A, 4A, 5A, and 6A are plan views illustrating a method of manufacturing or fabricating a memory device, according to some example embodiments of inventive concepts. FIGS. 2B, 3B, 4B, 5B, and 6B are cross-sectional views illustrating a method of manufacturing or fabricating a memory device, according to some example embodiments of inventive concepts, taken along lines B1-B1' of FIGS. 2A, 3A, 4A, 5A, and 6A, respectively. FIGS. 2C, 3C, 4C, 5C, and 6C are cross-sectional views illustrating a method of manufacturing or fabricating a memory device, according to some example embodiments of inventive concepts, taken along lines C1-C1' of FIGS. 2A, 3A, 4A, 5A, and 6A, respectively.

Figure 2A:
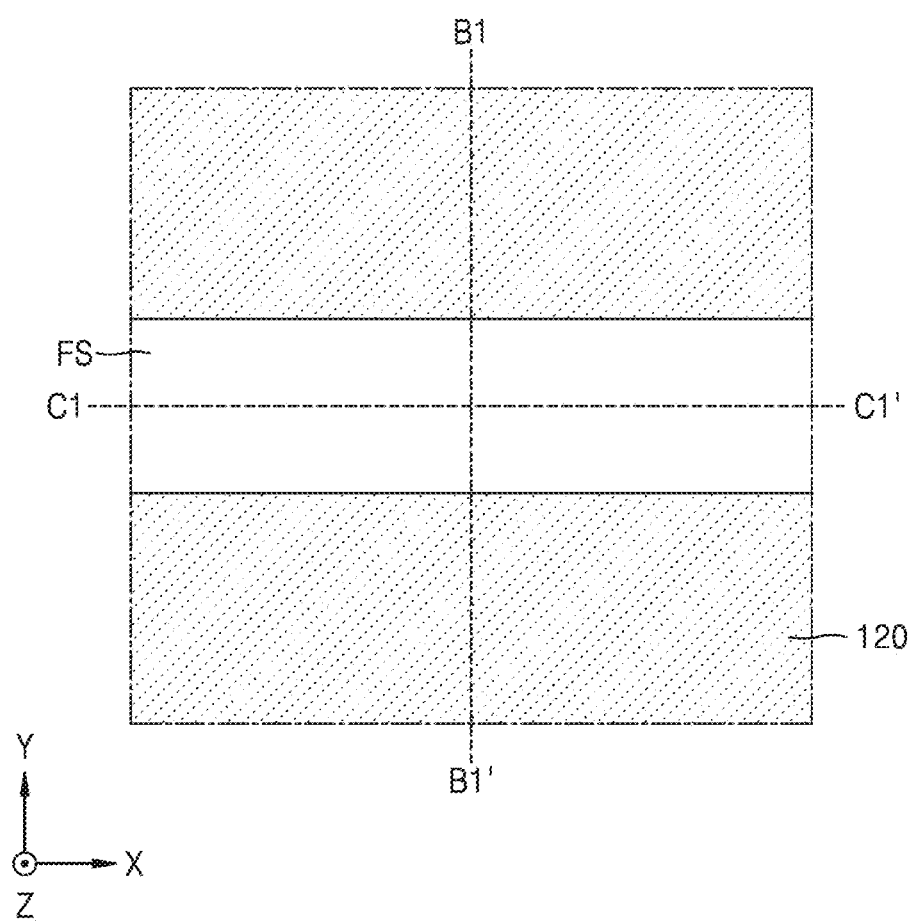
FIGS. 2A, 3A, 4A, 5A, and 6A are plan views illustrating a method of manufacturing a memory device, according to some example embodiments of inventive concepts.
Figure 2B:
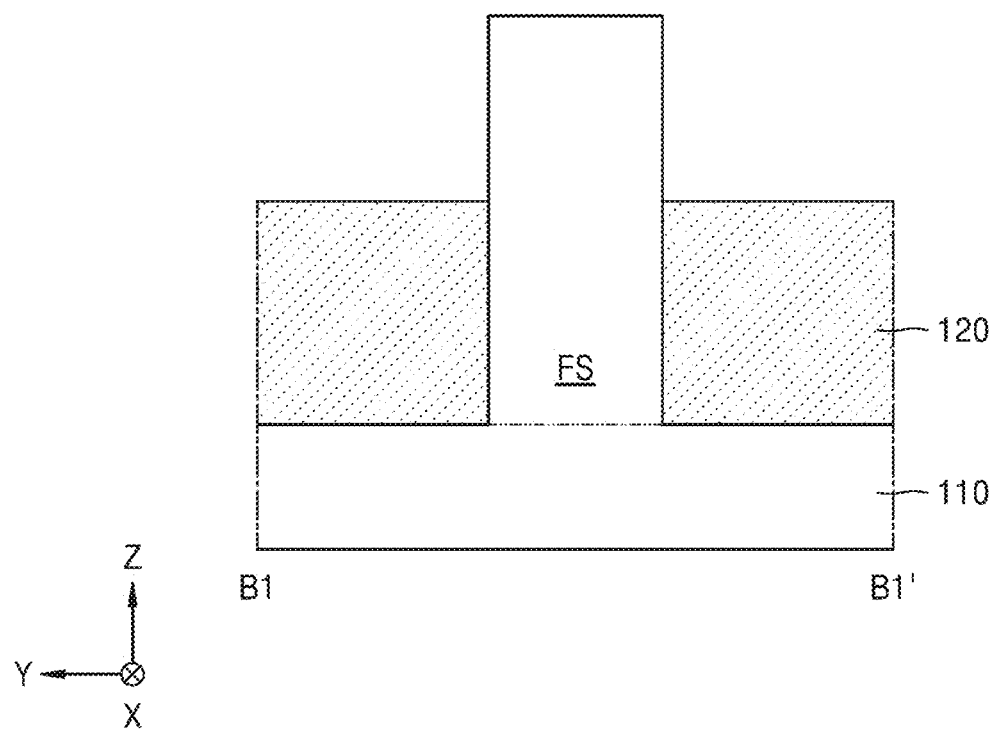
FIGS. 2B, 3B, 4B, 5B, and 6B are cross-sectional views illustrating a method of manufacturing a memory device, according to some example embodiments of inventive concepts, taken along lines B1-B1' of FIGS. 2A, 3A, 4A, 5A, and 6A, respectively.
Figure 2C:
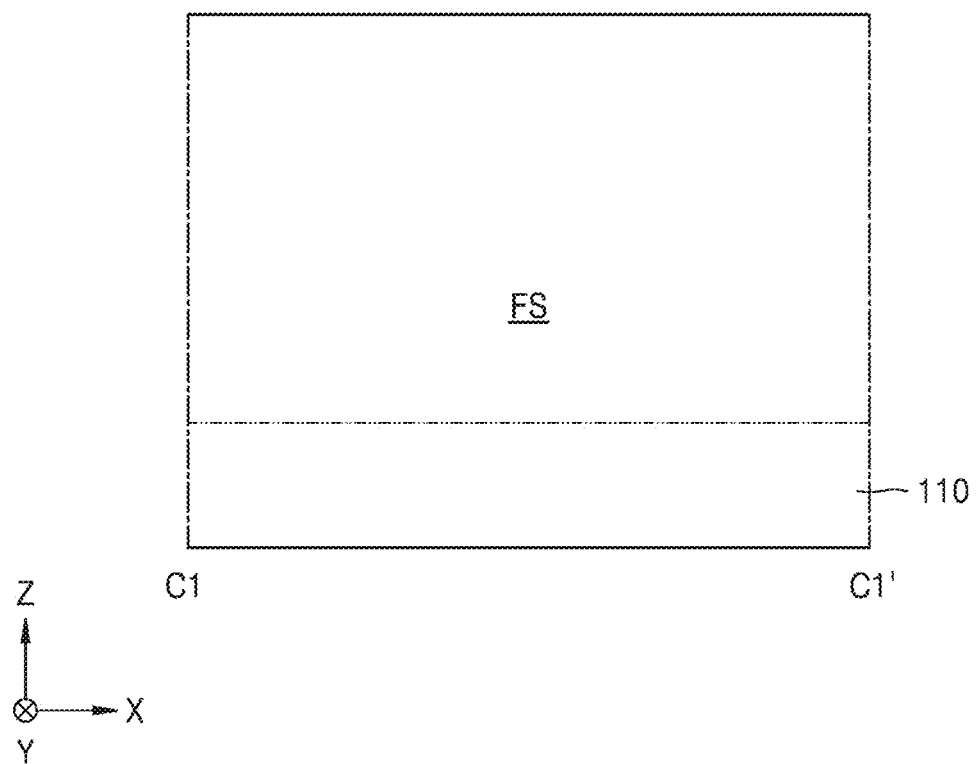
FIGS. 2C, 3C, 4C, 5C, and 6C are cross-sectional views illustrating a method of manufacturing a memory device, according to some example embodiments of inventive concepts, taken along lines C1-C1' of FIGS. 2A, 3A, 4A, 5A, and 6A, respectively.

Referring to FIGS. 2A to 2C, the fin structure FS extending in the first horizontal direction (the X direction) may be formed on the substrate 110. In some example embodiments, the fin structure FS may be formed by etching (e.g. dry etching) the substrate 110. Alternatively or additionally, in some example embodiments, the fin structure FS may be formed by an epitaxial process such as a heteroepitaxial process and/or a homoepitaxial process. The device isolation layer 120 defining the fin structure FS may be formed on the substrate 110. For example, the device isolation layer 120 may be deposited with a process such as a chemical vapor deposition (CVD) process and/or a spin-on glass (SOG) process.

Figure 3A:
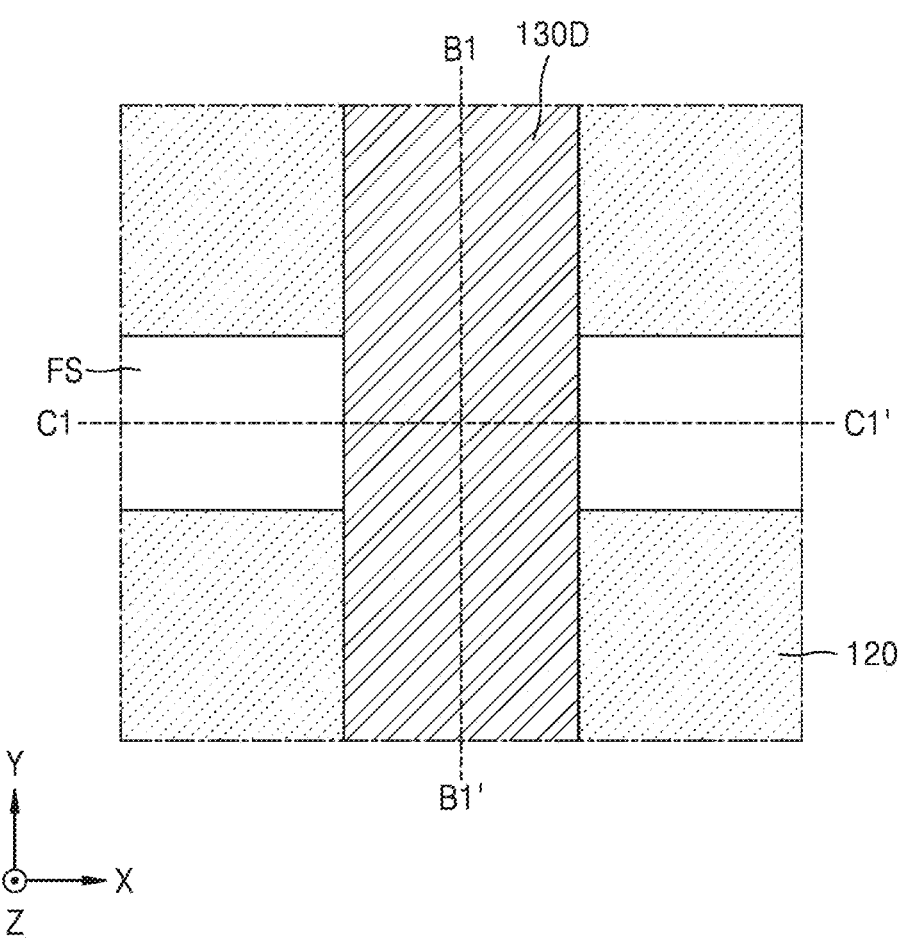
Figure 3B:
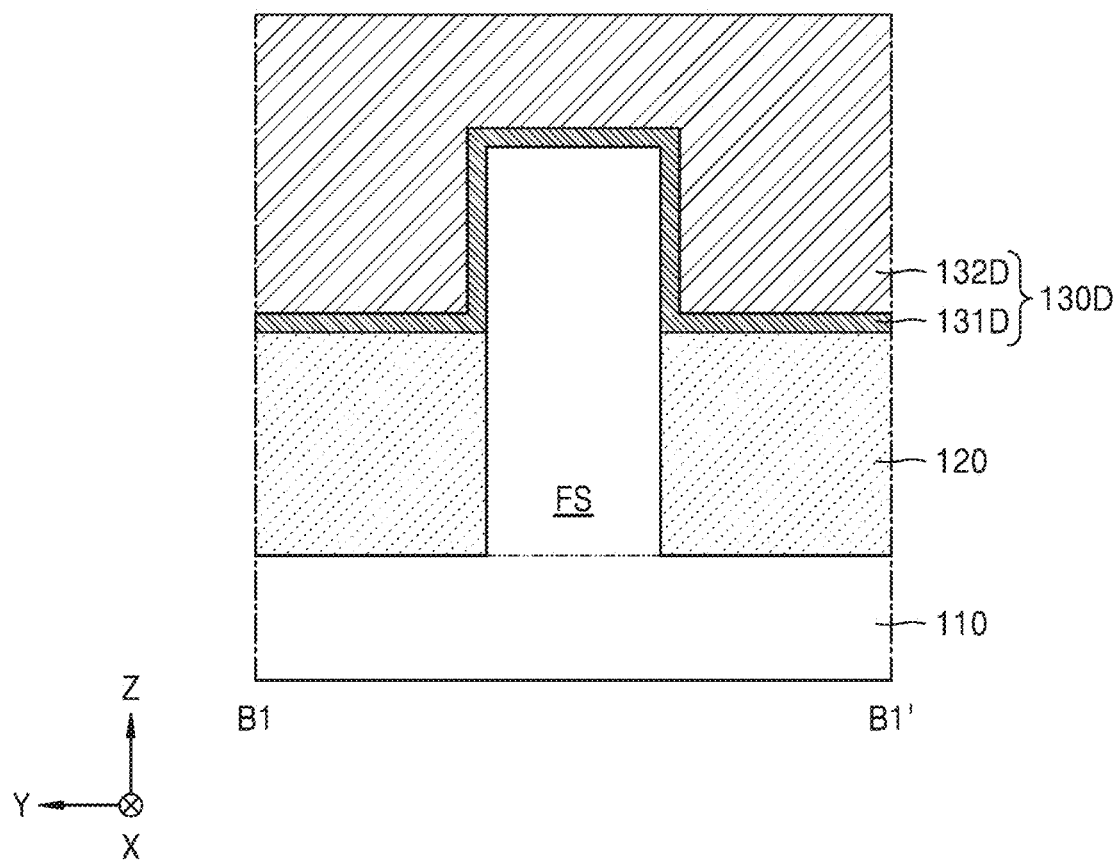
Figure 3C:
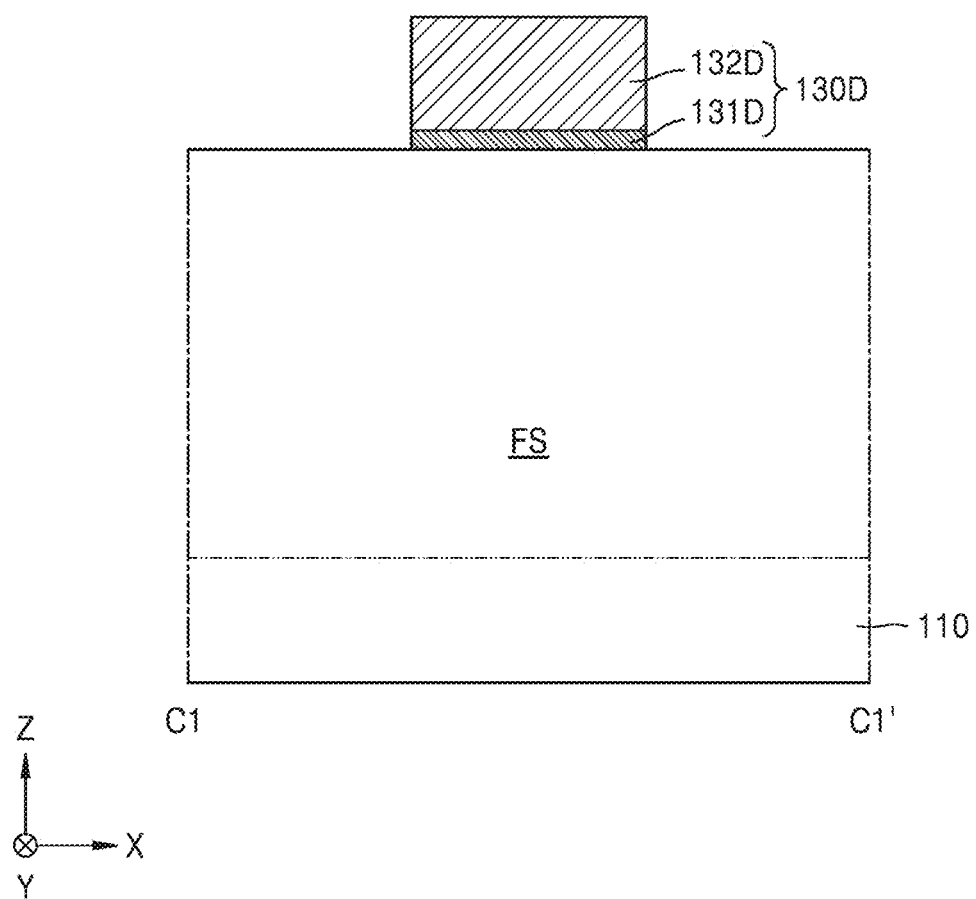

Referring to FIGS. 3A to 3C, a dummy gate structure 130D extending in the second horizontal direction (the Y direction) may be formed on the fin structure FS and the device isolation layer 120. The dummy gate structure 130D may include a dummy insulating layer 131D on the fin structure FS and the device isolation layer 120 and a dummy gate electrode layer 132D on the dummy insulating layer 131D. The dummy insulating layer 131D may include, for example, oxide, such as silicon oxide. The dummy gate electrode layer 132D may include, for example, polysilicon such as doped or undoped polysilicon.

Figure 4A:
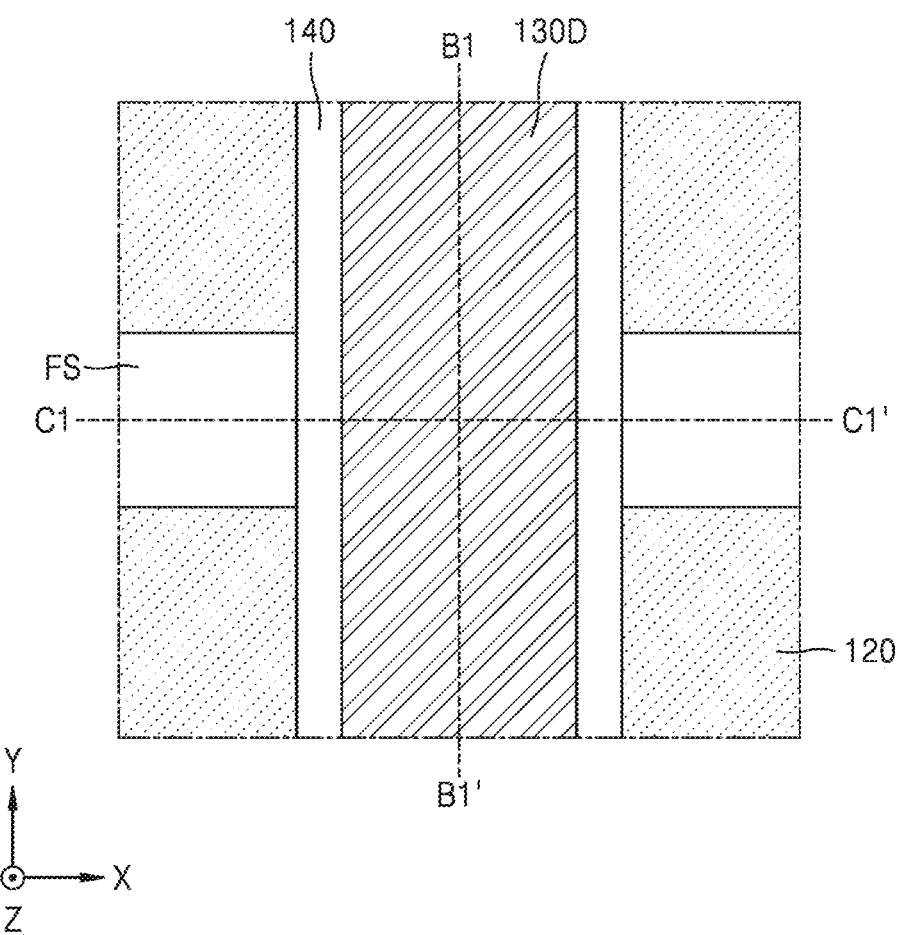
Figure 4B:
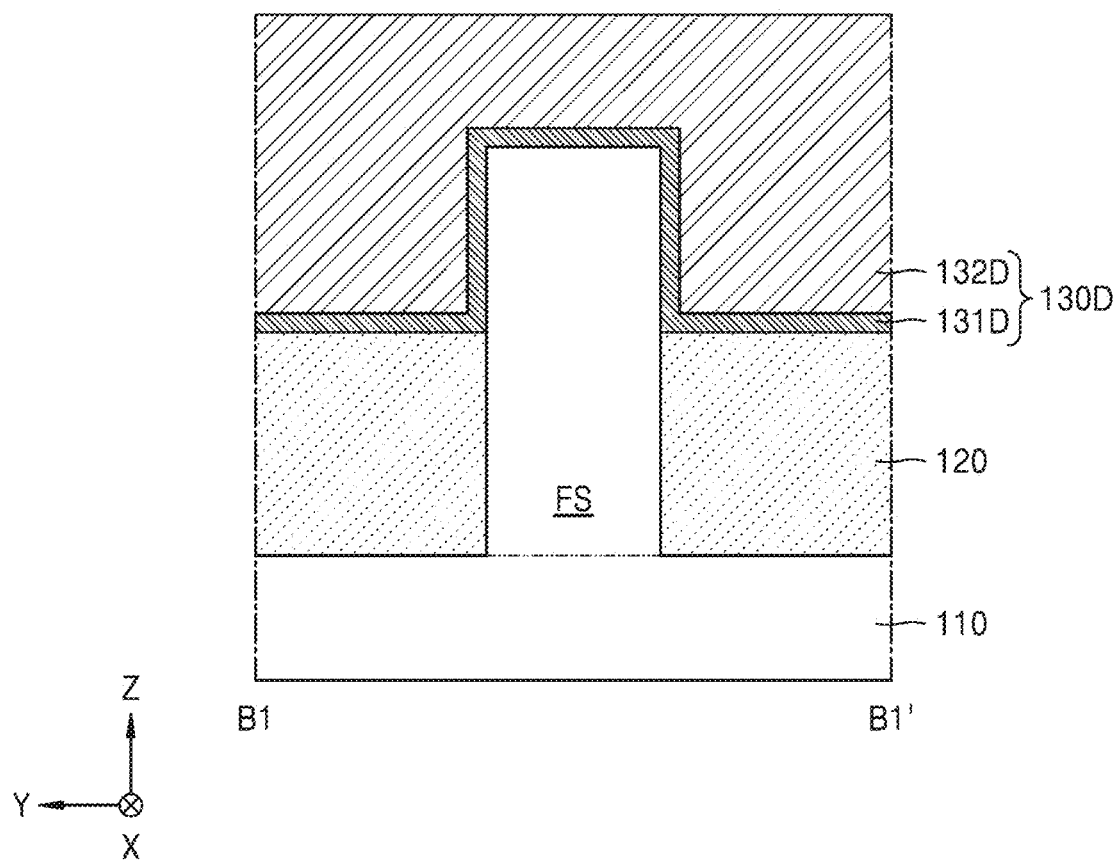
Figure 4C:
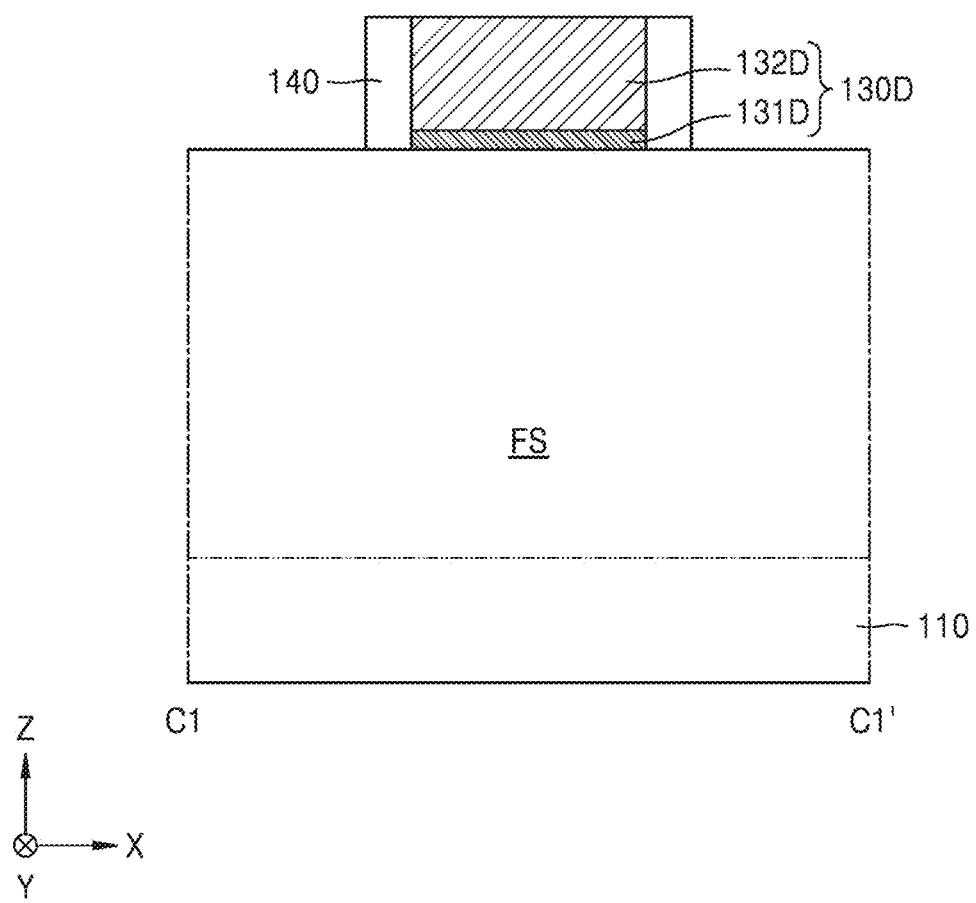

Referring to FIGS. 4A to 4C, two spacers 140 may be formed on both sides of the dummy gate structure 130D, respectively. For example, a spacer layer may be formed on a resultant structure of FIGS. 3A to 3C with, e.g., a conformal deposition process and then anisotropically etched with, e.g., a dry etching process to form the two spacers 140 from the spacer layer.

Figure 5A:
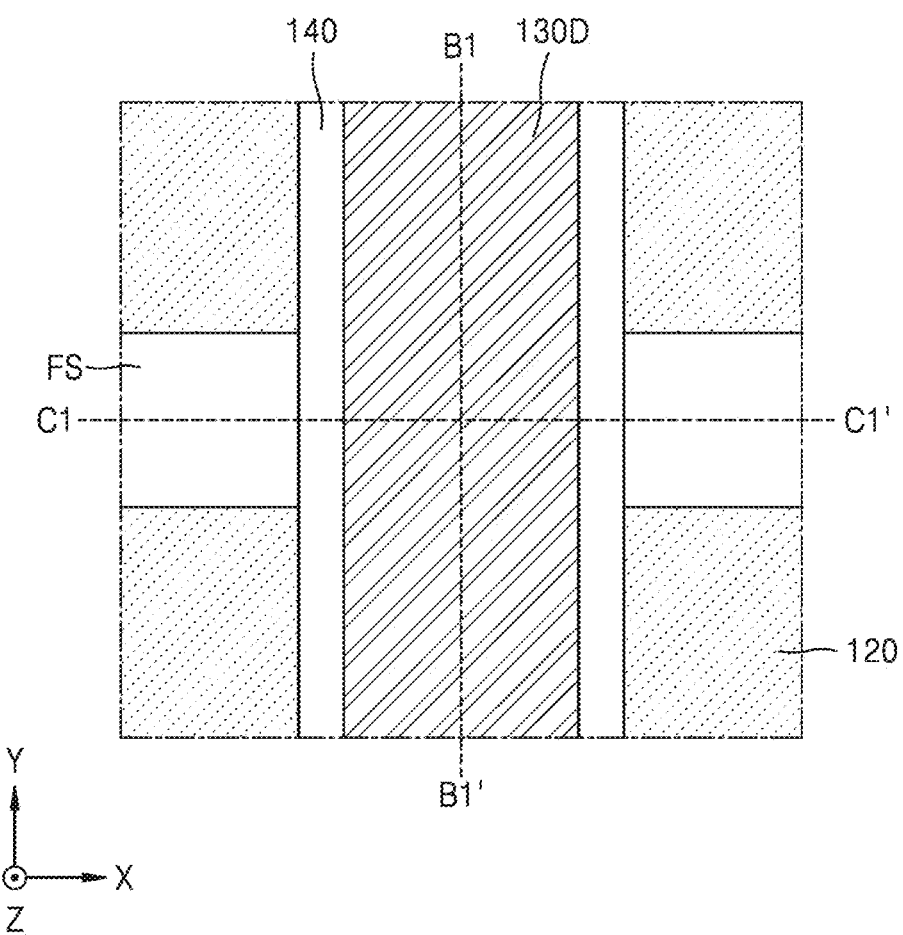
Figure 5B:
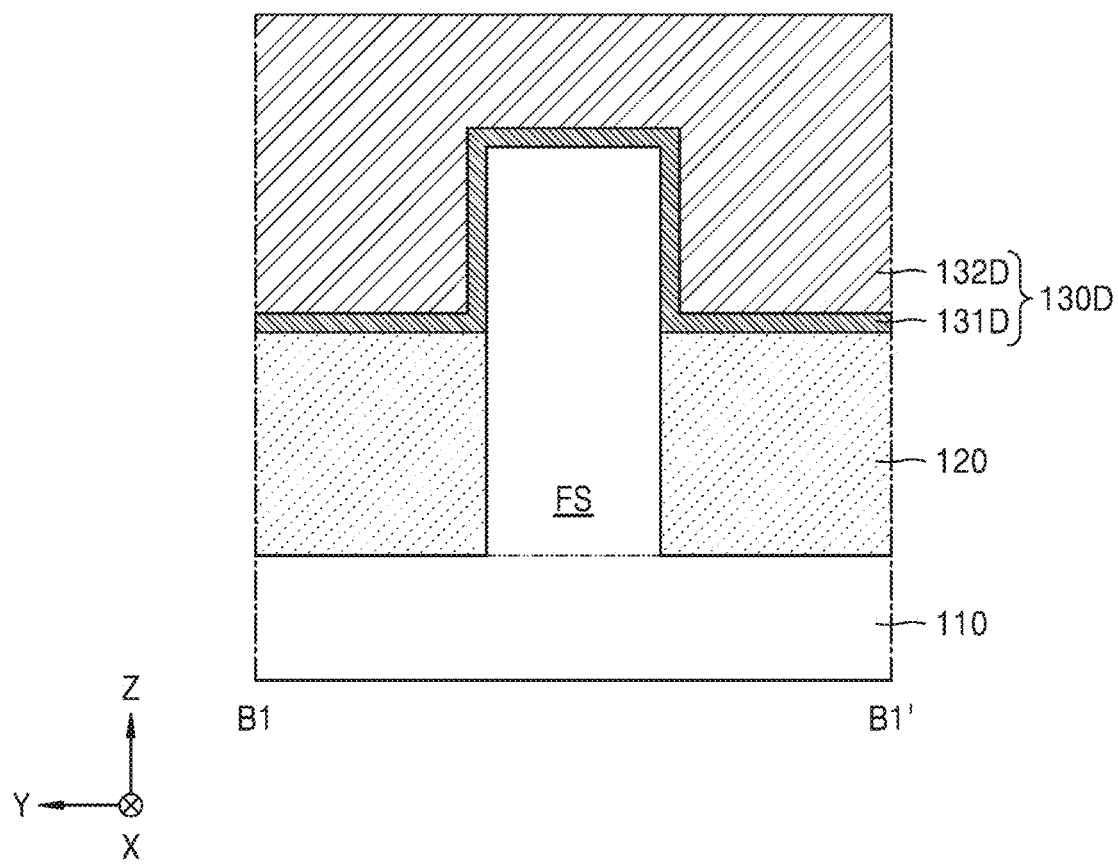
Figure 5C:
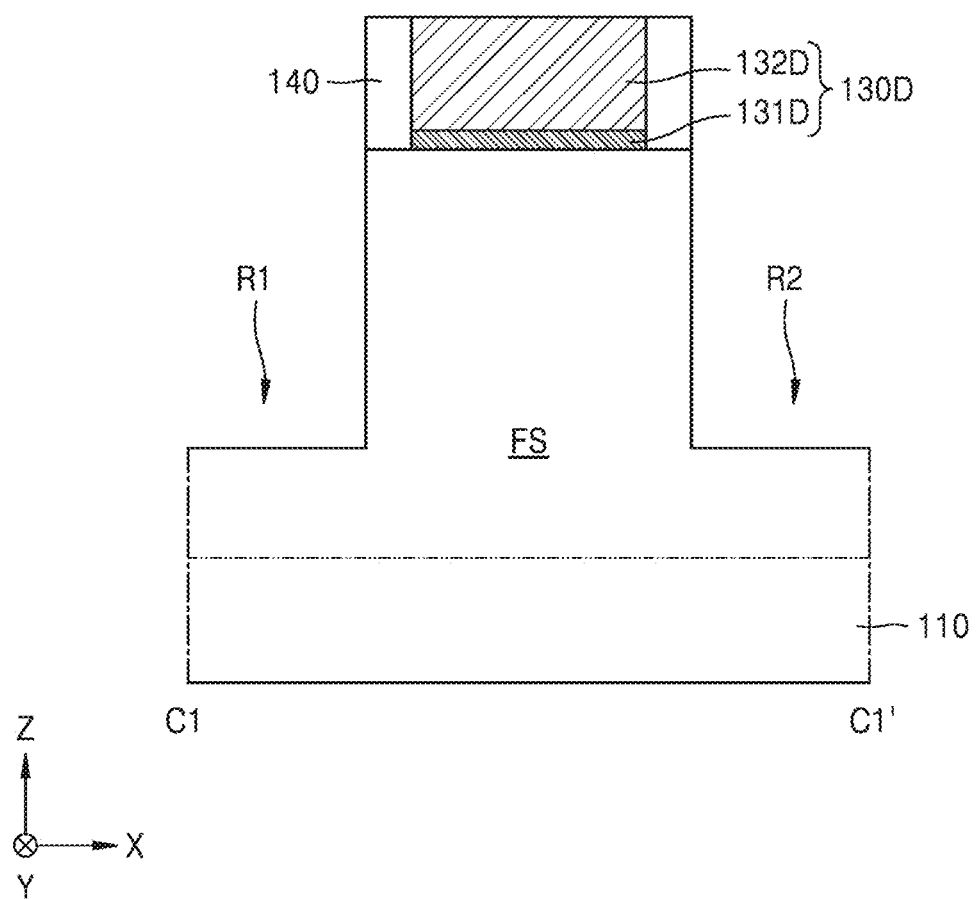

Referring to FIGS. 5A to 5C, a portion of the fin structure FS that is not covered by the dummy gate structure 130D and the spacers 140 may be etched to form a first recess R1 and a second recess in the fin structure FS. In some example embodiments, the operation of forming the first recess R1 and the second recess R2 may be omitted.

Figure 6A:
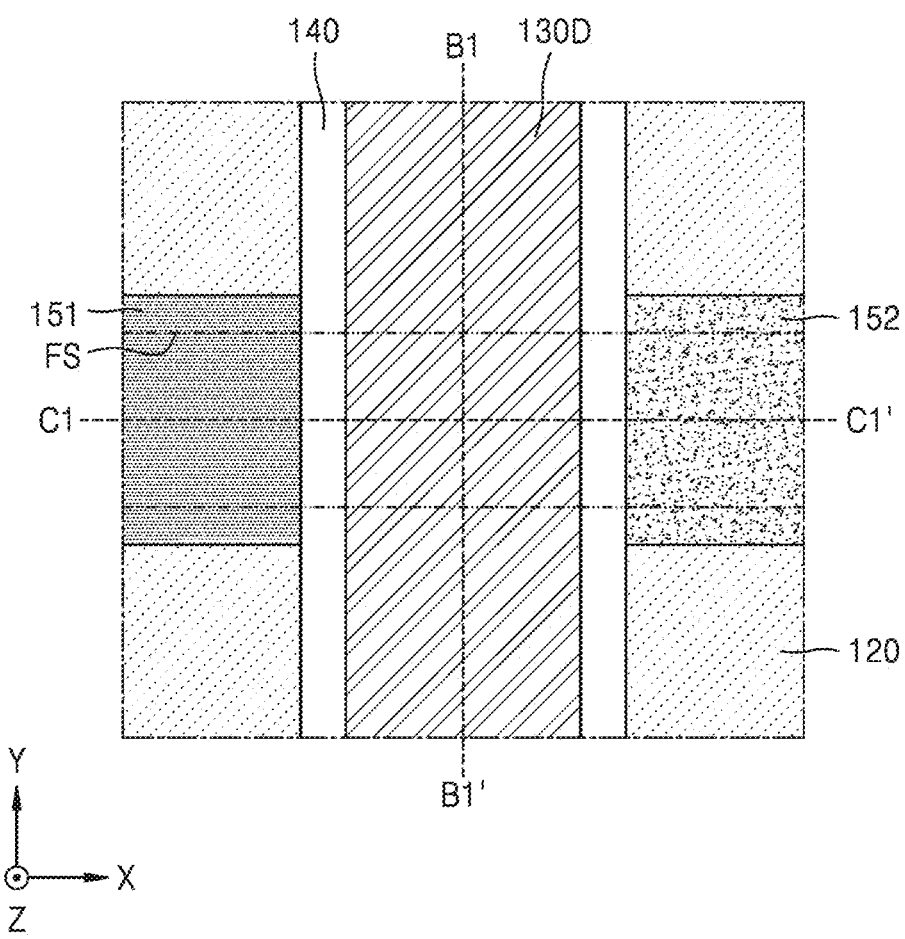
Figure 6B:
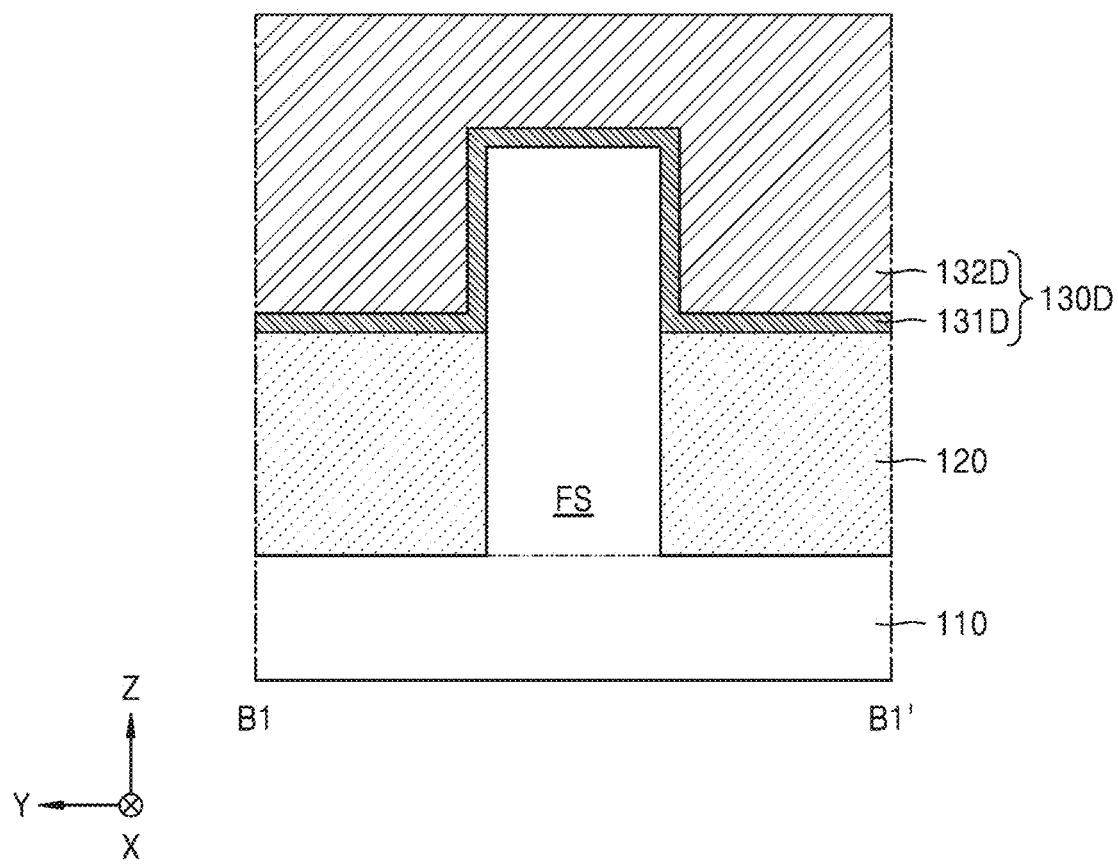
Figure 6C:
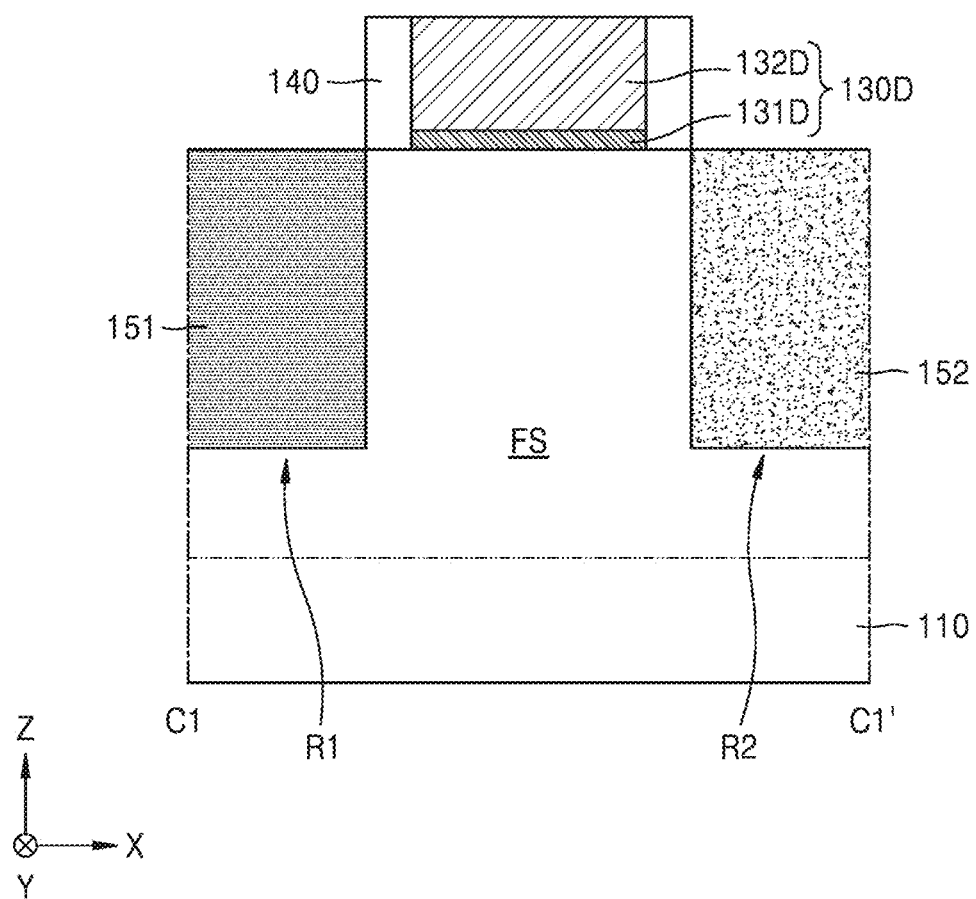

Referring to FIGS. 6A to 6C, a first source/drain 151 may be grown (e.g. epitaxially grown) from the first recess R1 and a second source/drain 152 may be grown (e.g. epitaxially grown) from the second recess R2. The first source/drain 151 and the second source/drain 152 may be formed by such growth. Alternatively or additionally, in some example embodiments, the first source/drain 151 and the second source/drain 152 may be formed by doping (e.g. implanting) two portions of the fin structure FS with dopants of different conductivity-types, respectively. In some example embodiments, impurities of a first conductivity-type may be incorporated in-situ during the growth of the first source/drain 151, and/or impurities of a second conductivity-type may be incorporated in-situ during the growth of the second source/drain 152; however, example embodiments are not limited thereto.

Referring to FIGS. 6A to 6C and FIGS. 1A to 1C, an interlayer insulating layer (not shown) may be formed on a resultant structure of FIGS. 6A to 6C. The interlayer insulating layer may contact the spacer 140. The interlayer insulating layer may expose a top surface of the dummy gate structure 130D. Thereafter, the dummy gate structure 130D may be removed. The gate structure 130 may be formed in an empty space defined by the two spacers 140. For example, the trap layer 131, the blocking layer 132, and the gate electrode layer 133 stacked in the space defined by the two spacers 140 may be sequentially formed.

The memory device 100 may be formed according to the manufacturing method described above with reference to FIGS. 1A to 1C, 2A to 2C, 3A to 3C, 4A to 4C, 5A to 5C, and 6A to 6C.

Figure 7:
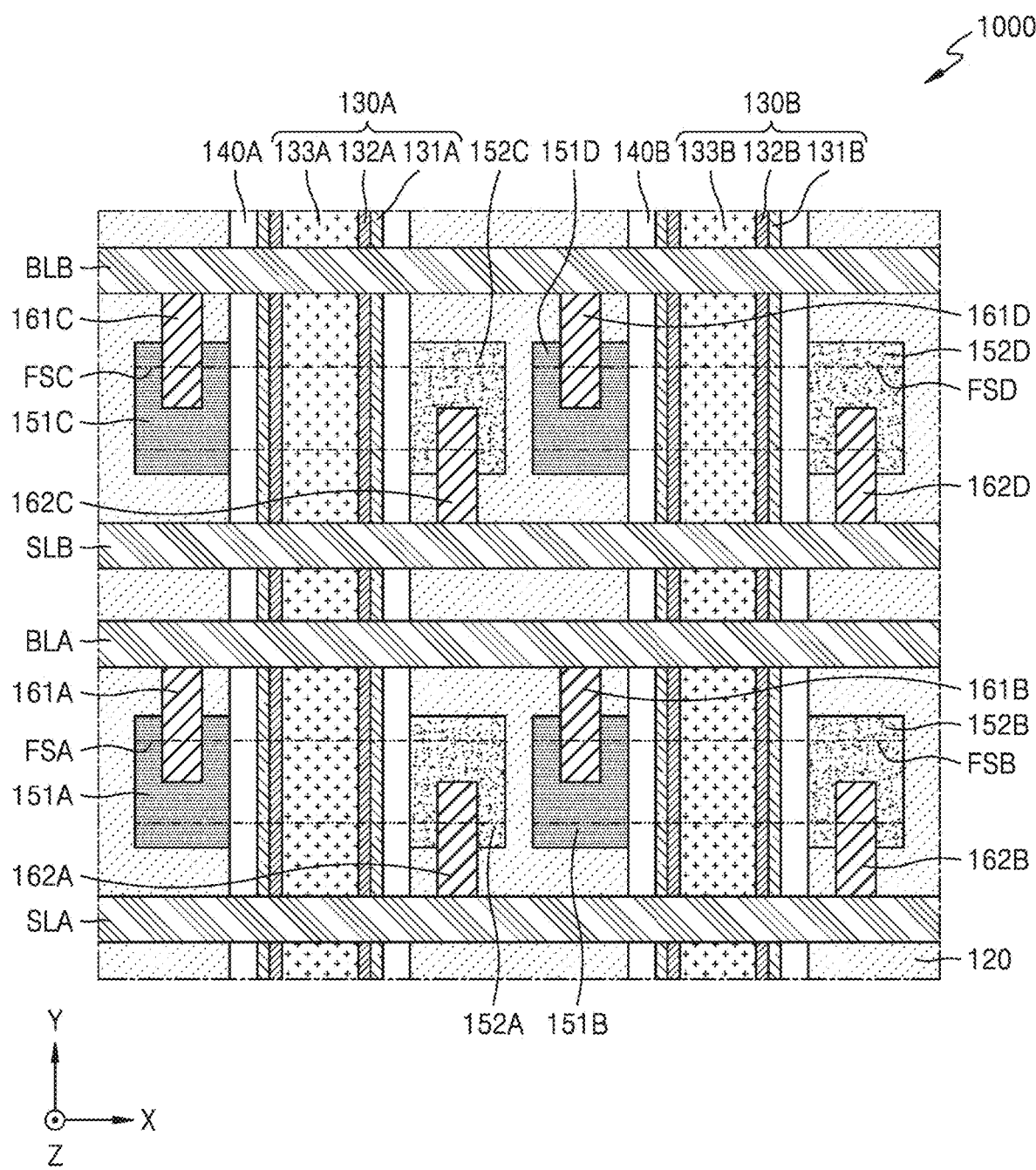
FIG. 7 is a plan view illustrating a memory device according to an example embodiment of inventive concepts.

FIG. 7 is a plan view illustrating a memory device 1000 according to some example embodiments of inventive concepts.

Referring to FIG. 7, the memory device 1000 may include a substrate. The substrate may include a semiconductor material, such as a group IV semiconductor material, a group III-V semiconductor material, or a group II-VI semiconductor material. The group IV semiconductor material may include, for example, one or more of silicon (Si), germanium (Ge), or silicon (Si)-germanium (Ge). The group III-V semiconductor material may include, for example, one or more of gallium arsenide (GaAs), indium phosphide (InP), gallium phosphide (GaP), indium arsenide (InAs), indium antimonide (InSb), or indium gallium arsenide (InGaAs). The group II-VI semiconductor material may include, for example, zinc telluride (ZnTe) and/or cadmium sulfide (CdS).

The memory device 1000 may further include a plurality of fin structures on the substrate, for example, first to fourth fin structures FSA to FSD. Although the memory device 1000 is illustrated as including four fin structures, for example, first to fourth fin structures FSA to FSD in FIG. 7, the number of fin structures included in the memory device 1000 is not limited to four, and may be greater than or less than four. Each of the first to fourth fin structures FSA to FSD may extend in the first horizontal direction (the X direction). The second fin structure FSB may be separated from the first fin structure FSA in the first horizontal direction (the X direction). The third fin structure FSC may be separated from the first fin structure FSA in the second horizontal direction (the Y direction). The fourth fin structure FSD may be separated from the second fin structure FSB in the second horizontal direction (the Y direction) and may be separated from the third fin structure FSC in the first horizontal direction (the X direction).

Each of the first to fourth fin structures FSA to FSD may include at least one of single crystal silicon, polysilicon, oxide semiconductor, germanium, silicon-germanium, and TMDC. The oxide semiconductor may include, for example, one or more of silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuGaO_2$, $SrCu2O_2$, $SnO_2$, and the like. The TMDC may be expressed, for example, as $MX_2$, where M is a transition metal and X is a chalcogen element. M may include, for example, Mo, W, Nb, V, Ta, Ti, Zr, Hf, Tc, or Re, and X may include, for example, S, Se, or Te. The TMDC material may include, for example, $MoS_2$, $MoSe_2$, $MoTe_2$, $WS_2$, $WS_2$, $WTe_2$, $ZrS_2$, $ZrSe_2$, $HfS_2$, $HfSe_2$, $NbSe_2$, or $ReSe_2$.

In some example embodiments, the substrate and the first to fourth fin structures FSA to FSD may include the same material. For example, the substrate and the first to fourth fin structures FSA to FSD may include silicon (Si). For example, the substrate and the first to fourth fin structures FSA to FSD may include germanium (Ge). For example, the substrate and the first to fourth fin structures FSA to FSD may include silicon (Si)-germanium (Ge). In some example embodiments, the substrate may be integrally formed with the first to fourth fin structures FSA to FSD. For example, there may not be a physical boundary between the substrate and the first to fourth fin structures FSA to FSD.

The memory device 1000 may further include a device isolation layer 120. The device isolation layer 120 is disposed on the substrate and may define the first to fourth fin structures FSA to FSD. The device isolation layer 120 may include, for example, at least one of silicon oxide and silicon nitride.

The memory device 1000 may further include a first gate structure 130A and a second gate structure 130B. The first gate structure 130A may be disposed on the first and third fin structures FSA and FSC. The first gate structure 130A may cross the first and third fin structures FSA and FSC. The first gate structure 130A may extend in the second horizontal direction (the Y direction). The second gate structure 130B may be disposed on the second and fourth fin structures FSB and FSD. The second gate structure 130B may cross the second and fourth fin structures FSB and FSD. The second gate structure 130B may extend in the second horizontal direction (the Y direction).

The first gate structure 130A may include a first trap layer 131A, a first blocking layer 132A, and a first gate electrode layer 133A that are sequentially stacked on the first and third fin structures FSA and FSC. In some example embodiments, the first gate structure 130A may further include a first tunneling insulating layer between the first trap layer 131A and the first and third fin structures FSA and FSC. In some example embodiments, the first trap layer 131A may directly contact the first and third fin structures FSA and FSC. By omitting the first tunneling insulating layer, an operating speed of the memory device 1000 may be increased.

The second gate structure 130B may include a second trap layer 131B, a second blocking layer 132B, and a second gate electrode layer 133B that are sequentially stacked on the second and fourth fin structures FSB and FSD. In some example embodiments, the second gate structure 130B may further include a second tunneling insulating layer between the second trap layer 131B and the second and fourth fin structures FSB and FSD. In some example embodiments, the second trap layer 131B may directly contact the second and fourth fin structures FSB and FSD. By omitting the second tunneling insulating layer, the operating speed of the memory device 1000 may be increased.

The first trap layer 131A and the second trap layer 131B may include at least one of silicon nitride, hafnium oxide, and silicon oxynitride. During a write operation of the memory device 1000, charges may be trapped in the first trap layer 131A and/or the second trap layer 131B, and a read operation of the memory device 1000 may be performed by detecting a change in source-drain current due to the trapped charges. An erase operation of the memory device 1000 may be performed by removing the trapped charges.

The first blocking layer 132A may prevent or reduce the amount of and/or the impact from charges trapped in the first trap layer 131A from escaping to the first gate electrode layer 133A. The second blocking layer 132B may prevent charges trapped in the second trap layer 131B from escaping to the second gate electrode layer 133B. The first blocking layer 132A and the second blocking layer 132B may include, for example, at least one of silicon oxide, aluminum oxide, and hexagonal boron nitride.

The first gate electrode layer 133A and the second gate electrode layer 133B may include, for example, at least one of tungsten, titanium nitride, titanium, ruthenium, molybdenum, nickel, and graphene.

The memory device 1000 may further include a first spacer 140A and a second spacer 140B. The two first spacers 140A may be respectively located on both side surfaces of the first gate structure 130A. The two second spacers 140B may be respectively located on both side surfaces of the second gate structure 130B. The first and second spacers 140A and 140B may include at least one of silicon oxide and silicon nitride.

The memory device 1000 may further include first to eighth sources/drains 151A, 152A, 151B, 152B, 151C, 152C, 151D, and 152D.

The first source/drain 151A may be located at one end of the first fin structure FSA, and the second source/drain 152A may be located at the other end of the first fin structure FSA. The second source/drain 152A may be separated from the first source/drain 151A in the first horizontal direction (the X direction). The first source/drain 151A may include at least one of single crystal silicon, polysilicon, oxide semiconductor, germanium, silicon-germanium, and TMDC. In some example embodiments, the first source/drain 151A and the first fin structure FSA may include the same material. The second source/drain 152A may include at least one of single crystal silicon, polysilicon, oxide semiconductor, germanium, silicon-germanium, and TMDC. In some example embodiments, the second source/drain 152A and the first fin structure FSA may include the same material.

The third source/drain 151B may be located at one end of the second fin structure FSB, and the fourth source/drain 152B may be located at the other end of the second fin structure FSB. The fourth source/drain 152B may be separated from the third source/drain 151B in the first horizontal direction (the X direction). The third source/drain 151B may include at least one of single crystal silicon, polysilicon, oxide semiconductor, germanium, silicon-germanium, and TMDC. In some example embodiments, the third source/drain 151B and the second fin structure FSB may include the same material. The fourth source/drain 152B may include at least one of single crystal silicon, polysilicon, oxide semiconductor, germanium, silicon-germanium, and TMDC. In some example embodiments, the fourth source/drain 152B and the second fin structure FSB may include the same material.

The fifth source/drain 151C may be located at one end of the third fin structure FSC, and the sixth source/drain 152C may be located at the other end of the third fin structure FSC. The sixth source/drain 152C may be separated from the fifth source/drain 151C in the first horizontal direction (the X direction). The fifth source/drain 151C may include at least one of single crystal silicon, polysilicon, oxide semiconductor, germanium, silicon-germanium, and TMDC. In some example embodiments, the fifth source/drain 151C and the third fin structure FSC may include the same material. The sixth source/drain 152C may include at least one of single crystal silicon, polysilicon, oxide semiconductor, germanium, silicon-germanium, and TMDC. In some example embodiments, the sixth source/drain 152C and the third fin structure FSC may include the same material.

The seventh source/drain 151D may be located at one end of the fourth fin structure FSD, and the eighth source/drain 152D may be located at the other end of the fourth fin structure FSD. The eighth source/drain 152D may be separated from the seventh source/drain 151D in the first horizontal direction (the X direction). The seventh source/drain 151D may include at least one of single crystal silicon, polysilicon, oxide semiconductor, germanium, silicon-germanium, and TMDC. In some example embodiments, the seventh source/drain 151D and the fourth fin structure FSD may include the same material. The eighth source/drain 152D may include at least one of single crystal silicon, polysilicon, oxide semiconductor, germanium, silicon-germanium, and TMDC. In some example embodiments, the eighth source/drain 152D and the fourth fin structure FSD may include the same material.

The first source/drain 151A, the third source/drain 151B, the fifth source/drain 151C, and the seventh source/drain 151D may be doped with or have incorporated therein first conductivity-type dopants. In addition, the second source/drain 152A, the fourth source/drain 152B, the sixth source/drain 152C, and the eighth source/drain 152D may be doped with or have incorporated therein second conductivity-type dopants that have a different conductivity-type from the first conductivity-type dopants. For example, the first source/drain 151A, the third source/drain 151B, the fifth source/drain 151C, and the seventh source/drain 151D may be doped with N-type dopants, and the second source/drain 152A, the fourth source/drain 152B, the sixth source/drain 152C, and the eighth source/drain 152D may be doped with P-type dopants. Conversely, the first source/drain 151A, the third source/drain 151B, the fifth source/drain 151C, and the seventh source/drain 151D may be doped with P-type dopants and may not be doped with N-type dopants or may be doped with N-type dopants at a concentration several orders of magnitude lower than that of the P-type dopants, and the second source/drain 152A, the fourth source/drain 152B, the sixth source/drain 152C, and the eighth source/drain 152D may be doped with N-type dopants, and may not be doped with P-type dopants or may be doped with P-type dopants at a concentration several orders of magnitude lower than that of the N-type dopants. The P-type dopants may include, for example, at least one of boron (B), aluminum (Al), indium (In), and gallium (Ga). The N-type dopants may include, for example, at least one of phosphorus (P), arsenic (As), antimony (Sb), and bismuth (Bi).

The memory device 1000 may further include a first bit line BLA and a second bit line BLB. The first bit line BLA may extend in the first horizontal direction (the X direction). The first bit line BLA may be connected to the first source/drain 151A and the third source/drain 151B. The second bit line BLB may extend in the first horizontal direction (the X direction). The second bit line BLB may be connected to the fifth source/drain 151C and the seventh source/drain 151D. The first bit line BLA and the second bit line BLB may include metal, metal nitride, polysilicon, or a combination thereof. For example, the first bit line BLA and the second bit line BLB may include gold (Au), silver (Ag), copper (Cu), tungsten (W), aluminum (Al), titanium (Ti), titanium nitride (TiN), polysilicon, or a combination thereof. The first bit line BLA and the second bit line BLB may be apart from the substrate.

The memory device 1000 may further include a first source line SLA and a second source line SLB. The first source line SLA may extend in a first horizontal direction (the X direction). The first source line SLA may be connected to the second source/drain 152A and the fourth source/drain 152B. The second source line SLB may extend in the first horizontal direction (the X direction). The second source line SLB may be connected to the sixth source/drain 152C and the eighth source/drain 152D. The first source line SLA and the second source line SLB may include metal, metal nitride, polysilicon, or a combination thereof. For example, the first source line SLA and the second source line SLB may include gold (Au), silver (Ag), copper (Cu), tungsten (W), aluminum (Al), titanium (Ti), titanium nitride (TiN), polysilicon, or a combination thereof. The first source line SLA and the second source line SLB may be apart from the substrate.

The first bit line BLA may be separated from the first source line SLA in the second horizontal direction (the Y direction). Also, the second source line SLB may be separated from the first bit line BLA in the second horizontal direction (the Y direction). Also, the second bit line BLB may be separated from the second source line SLB in the second horizontal direction (the Y direction). Although the first horizontal direction (the X direction) is shown as being perpendicular to the second horizontal direction (the Y direction) in FIG. 7, an angle between the first horizontal direction (the X direction) and the second horizontal direction (the Y direction) is not limited to 90 degrees.

The memory device 1000 may further include first to eighth connection structures 161A, 162A, 161B, 162B, 161C, 162C, 161D, and 162D. The first connection structure 161A may connect the first source/drain 151A to the first bit line BLA. The second connection structure 162A may connect the second source/drain 152A to the first source line SLA. The third connection structure 161B may connect the third source/drain 151B to the first bit line BLA. The fourth connection structure 162B may connect the fourth source/drain 152B to the first source line SLA. The fifth connection structure 161C may connect the fifth source/drain 151C to the second bit line BLB. The sixth connection structure 162C may connect the sixth source/drain 152C to the second source line SLB. The seventh connection structure 161D may connect the seventh source/drain 151D to the second bit line BLB. The eighth connection structure 162D may connect the eighth source/drain 152D to the second source line SLB. The first to eighth connection structures 161A, 162A, 161B, 162B, 161C, 162C, 161D, and 162D may include, for example, at least one of tungsten, titanium nitride, titanium, ruthenium, molybdenum, nickel, and graphene.

FIGS. 8A to 8E are plan views illustrating a method of manufacturing a memory device, according to an example embodiment of inventive concepts.

Figure 8A:
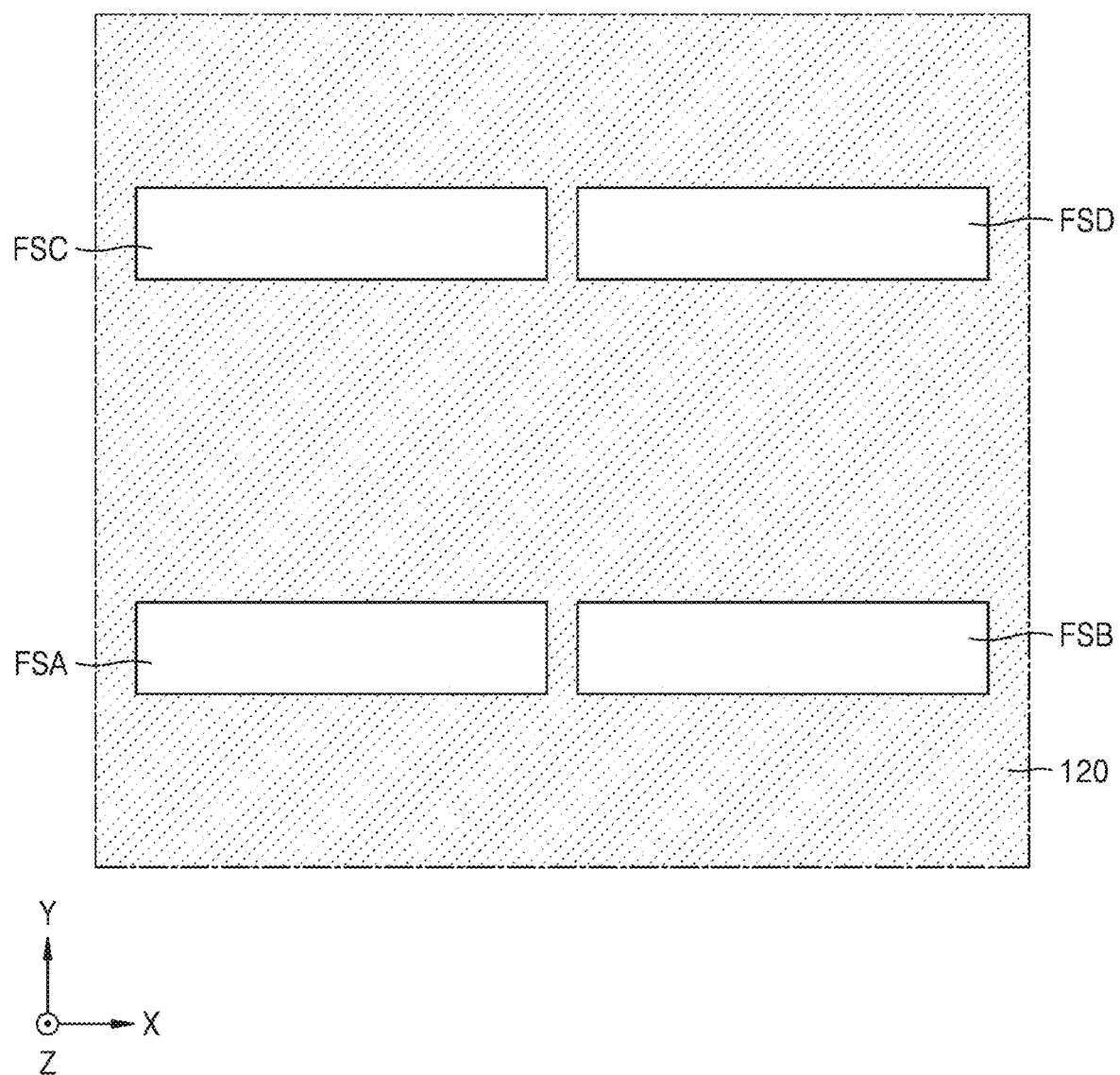
FIGS. 8A to 8E are plan views illustrating a method of manufacturing a memory device, according to an example embodiment of inventive concepts.

Referring to FIG. 8A, first to fourth fin structures FSA to FSD may be formed on a substrate. In some example embodiments, first to fourth fin structures FSA to FSD may be formed by etching the substrate. A device isolation layer 120 defining the first to fourth fin structures FSA to FSD may be formed on the substrate.

Figure 8B:
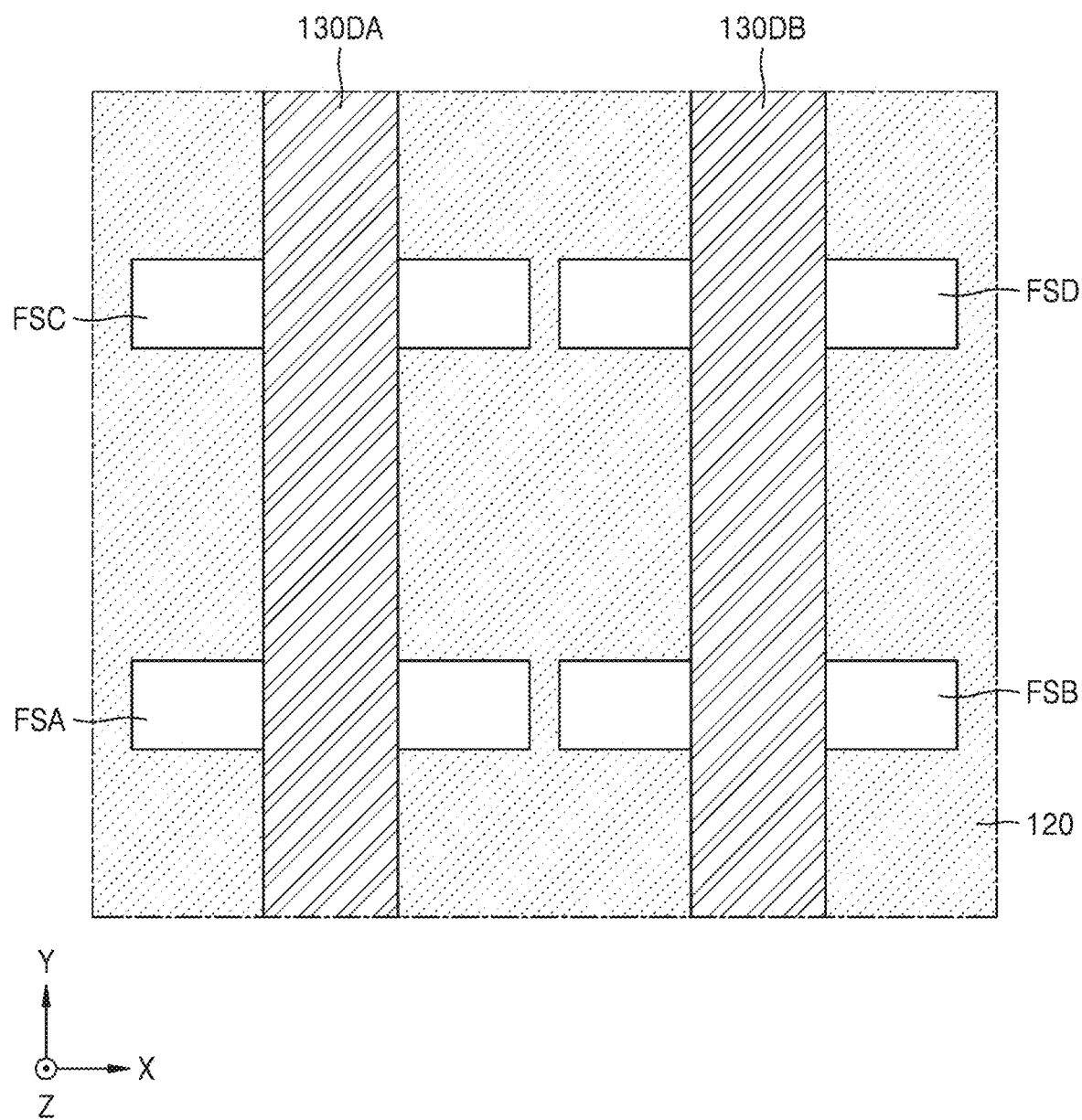

Referring to FIG. 8B, a first dummy gate structure 130DA extending in the second horizontal direction (the Y direction) may be formed on the first fin structure FSA, the third fin structure FSC, and the device isolation layer 120. The first dummy gate structure 130DA may include a first dummy insulating layer on the first fin structure FSA, the third fin structure FSC, and the device isolation layer 120 and a first dummy gate layer on the first dummy insulating layer. The first dummy insulating layer may include, for example, oxide, such as silicon oxide. The first dummy gate layer may include, for example, polysilicon.

In addition, a second dummy gate structure 130DB extending in the second horizontal direction (the Y direction) may be formed on the second fin structure FSB, the fourth fin structure FSD, and the device isolation layer 120. The second dummy gate structure 130DB includes a second dummy insulating layer on the second fin structure FSB, the fourth fin structure FSD, and the device isolation layer 120 and a second dummy gate layer on the second dummy insulating layer. The second dummy insulating layer may include, for example, oxide, such as silicon oxide. The second dummy gate layer may include, for example, polysilicon.

Figure 8C:
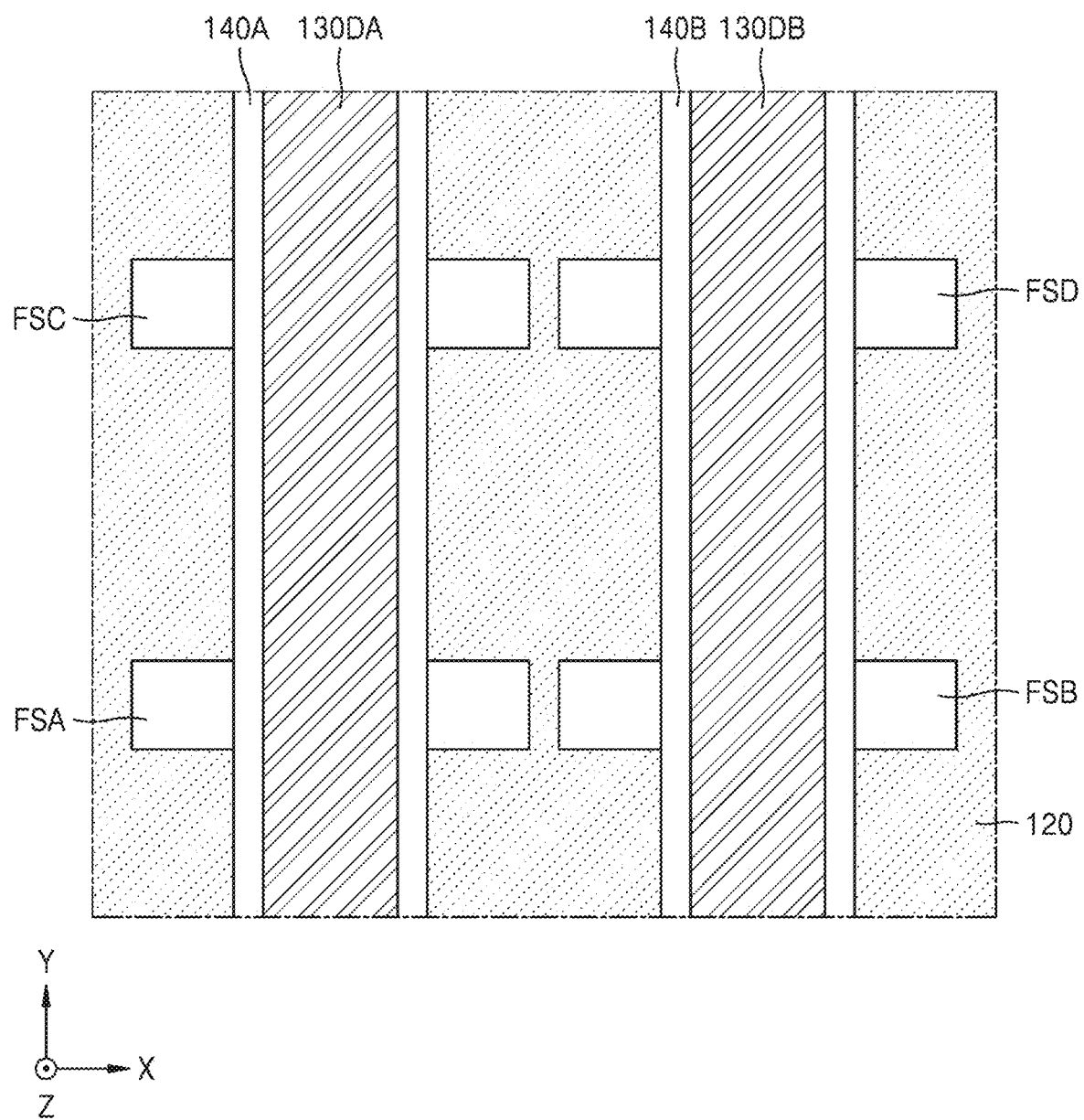

Referring to FIG. 8C, a pair of first spacers 140A may be respectively formed on both side surfaces of the first dummy gate structure 130DA. In addition, a pair of second spacers 140B may be respectively formed on both side surfaces of the second dummy gate structure 130DB. For example, a spacer layer may be formed on a resultant structure of FIG. 8B and anisotropically etched to form the pair of first spacers 140A and the pair of second spacers 140B from the spacer layer.

Figure 8D:
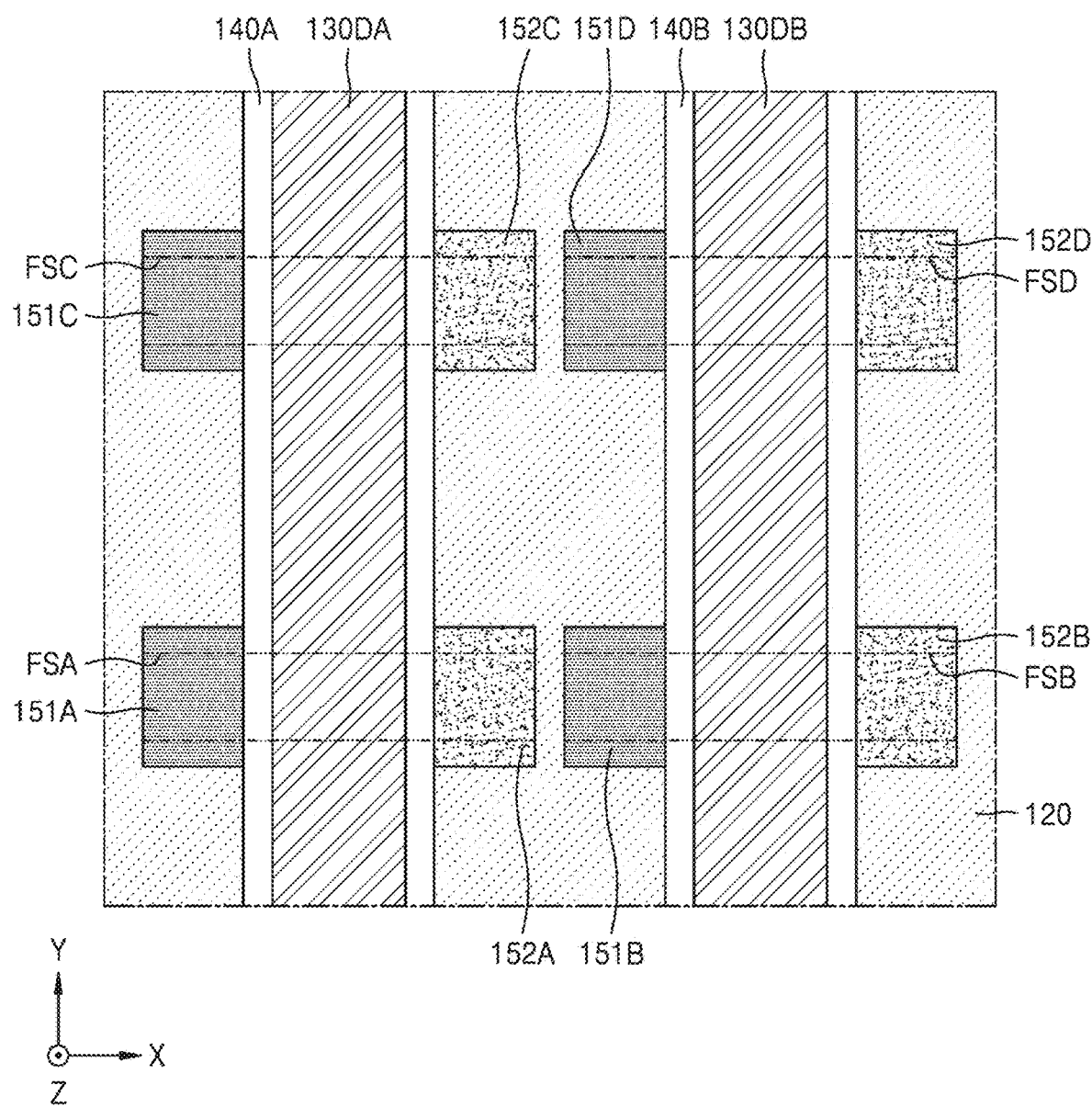

Referring to FIG. 8D, a first source/drain 151A may be formed on one end of the first fin structure FSA. Also, a second source/drain 152A may be formed on the other end of the first fin structure FSA. Also, a third source/drain 151B may be formed on one end of the second fin structure FSB. In addition, a fourth source/drain 152B may be formed on the other end of the second fin structure FSB. Also, a fifth source/drain 151C may be formed on one end of the third fin structure FSC. Also, a sixth source/drain 152C may be formed on the other end of the third fin structure FSC. Also, a seventh source/drain 151D may be formed on one end of the fourth fin structure FSD. Also, an eighth source/drain 152D may be formed on the other end of the fourth fin structure FSD.

In some example embodiments, the first source/drain 151A and the second source/drain 152A may be formed by growing (e.g. epitaxially growing) the first source/drain 151A and the second source/drain 152A from the first fin structure FSA. In addition, the third source/drain 151B and the fourth source/drain 152B may be formed by growing (e.g. epitaxially growing) the third source/drain 151B and the fourth source/drain 152B from the second fin structure FSB. In addition, the fifth source/drain 151C and the sixth source/drain 152C may be formed by growing (e.g. epitaxially growing) the fifth source/drain 151C and the sixth source/drain 152C from the third fin structure FSC. In addition, the seventh source/drain 151D and the eighth source/drain 152D may be formed by growing (e.g. epitaxially growing) the seventh source/drain 151D and the eighth source/drain 152D from the fourth fin structure FSD.

In some example embodiments, the first source/drain 151A and the second source/drain 152A may be formed by doping both ends of the first fin structure FSA with dopants of different conductivity-types, respectively. In addition, the third source/drain 151B and the fourth source/drain 152B may be formed by doping both ends of the second fin structure FSB with dopants of different conductivity-types, respectively. In addition, the fifth source/drain 151C and the sixth source/drain 152C may be formed by doping both ends of the third fin structure FSC with dopants of different conductivity-types, respectively. In addition, the seventh source/drain 151D and the eighth source/drain 152D may be formed by doping both ends of the fourth fin structure FSD with dopants of different conductivity-types, respectively.

Figure 8E:
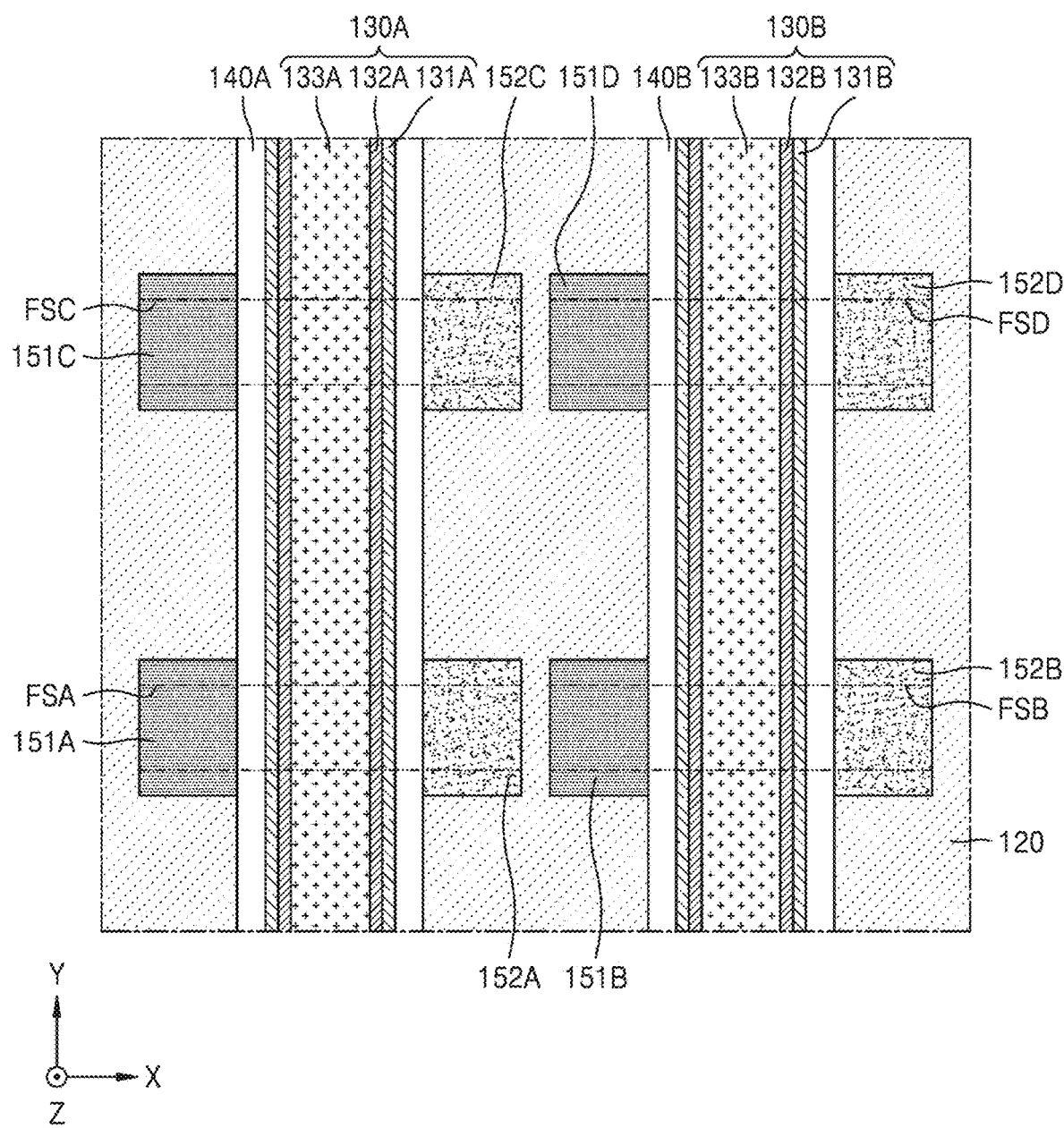

Referring to FIGS. 8D and 8E, an interlayer insulating layer (not shown) may be formed on a resultant structure of FIG. 8D. The interlayer insulating layer may contact the first spacer 140A and the second spacer 140B. The interlayer insulating layer may expose top surfaces of the first dummy gate structure 130DA and the second dummy gate structure 130DB. Thereafter, the first dummy gate structure 130DA and the second dummy gate structure 130DB may be removed. A first gate structure 130A may be formed in an empty space defined by the two first spacers 140A. For example, a first trap layer 131A, a first blocking layer 132A, and a first gate electrode layer 133A may be sequentially stacked and formed in the space defined by the two first spacers 140A. Also, a second gate structure 130B may be formed in an empty space defined by the two second spacers 140B. For example, a second trap layer 131B, a second blocking layer 132B, and a second gate electrode layer 133B may be sequentially stacked and formed in the space defined by the two second spacers 140B.

Next, first to eighth connection structures 161A, 162A, 161B, 162B, 161C, 162C, 161D, and 162D may be formed. Thereafter, a first bit line BLA, a second bit line BLB, a first source line SLA, and a second source line SLB may be formed. The memory device 1000 may be formed according to the manufacturing method described above with reference to FIGS. 7 and 8A to 8E.

While inventive concepts have been particularly shown and described with reference to embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other features described with references to one or more other figures.

What is claimed is:

1. A memory device comprising:
   a substrate;
   a fin structure on the substrate;
   a gate structure on the fin structure;
   a first source/drain at one end of the fin structure; and
   a second source/drain at another end of the fin structure,
   wherein the gate structure includes a trap layer, a blocking layer, and a gate electrode layer that are sequentially stacked on the fin structure,
   the first source/drain has dopants of a first conductivity-type incorporated therein, and
   the second source/drain has dopants of a second conductivity-type incorporated therein, the second conductivity-type different from the first conductivity-type.

2. The memory device of claim 1, wherein the fin structure includes at least one of single crystal silicon, polysilicon, oxide semiconductor, germanium, silicon-germanium, or transition metal dichalcogenide (TMDC).

3. The memory device of claim 1, wherein the trap layer includes at least one of silicon nitride, hafnium oxide, or silicon oxynitride.

4. The memory device of claim 1, wherein the blocking layer includes at least one of silicon oxide, aluminum oxide, or hexagonal boron nitride.

5. The memory device of claim 1, wherein the gate electrode layer includes at least one of tungsten, titanium nitride, titanium, ruthenium, molybdenum, nickel, or grapheme.

6. The memory device of claim 1, wherein the first source/drain includes at least one of single crystal silicon, polysilicon, oxide semiconductor, germanium, silicon-germanium, or transition metal dichalcogenide (TMDC).

7. The memory device of claim 1, wherein the second source/drain includes at least one of single crystal silicon, polysilicon, oxide semiconductor, germanium, silicon-germanium, or transition metal dichalcogenide (TMDC).

8. The memory device of claim 1, wherein the substrate and the fin structure include a same material or same materials.

9. The memory device of claim 8, wherein the substrate and the fin structure both include silicon.

10. The memory device of claim 1, wherein the fin structure directly contacts the trap layer.

11. A memory device comprising:
a substrate;
a first fin structure on the substrate;
a second fin structure separated from the first fin structure in a first horizontal direction;
a first source/drain located at one end of the first fin structure and having dopants of a first conductivity-type incorporated therein;
a second source/drain located at another end of the first fin structure and having dopants of a second conductivity-type incorporated therein, the second conductivity-type different from the first conductivity-type;
a third source/drain located at one end of the second fin structure and having dopants of the first conductivity-type incorporated therein;
a fourth source/drain located at another end of the second fin structure and having dopants of the second conductivity-type incorporated therein;
a first gate structure including a first trap layer, a first blocking layer, and a first gate electrode layer sequentially stacked on the first fin structure;
a second gate structure including a second trap layer, a second blocking layer, and a second gate electrode layer sequentially stacked on the second fin structure;
a first bit line connected to the first source/drain and the third source/drain; and
a first source line connected to the second source/drain and the fourth source/drain.

12. The memory device of claim 11, wherein the first bit line and the first source line extend in the first horizontal direction.

13. The memory device of claim 11, wherein the first gate structure and the second gate structure extend in a second horizontal direction.

14. The memory device of claim 11, further comprising:
a third fin structure separated from the first fin structure in a second horizontal direction;
a fifth source/drain at one end of the third fin structure and having dopants of the first conductivity-type incorporated therein; and
a sixth source/drain at another end of the third fin structure and having dopants of the second conductivity-type incorporated therein,
wherein the first gate structure extends on the third fin structure.

15. The memory device of claim 14, further comprising:
a second bit line connected to the fifth source/drain and extending in the first horizontal direction; and
a second source line connected to the sixth source/drain and extending in the first horizontal direction.

16. The memory device of claim 15, further comprising:
a fourth fin structure separated from the third fin structure in the first horizontal direction and separated from the second fin structure in the second horizontal direction;
a seventh source/drain at one end of the fourth fin structure and having dopants of the first conductivity-type incorporated therein; and
an eighth source/drain at the other end of the fourth fin structure and having dopants of the second conductivity-type incorporated therein,
wherein the second bit line is connected to the seventh source/drain, and
the second source line is connected to the eighth source/drain.

17. The memory device of claim 11, further comprising:
a first connection structure connecting the first source/drain to the first bit line;
a second connection structure connecting the second source/drain to the first source line;
a third connection structure connecting the third source/drain to the first bit line; and
a fourth connection structure connecting the fourth source/drain to the first source line.

18. The memory device of claim 11, wherein the first bit line is separated from the first source line in a second horizontal direction.

19. The memory device of claim 11, wherein the first bit line and the first source line are separated from the substrate.

20. A memory device comprising:
a silicon substrate;
a silicon fin structure on the silicon substrate;
a first source/drain at one end of the silicon fin structure and having dopants of a first conductivity-type incorporated therein;
a second source/drain at another end of the silicon fin structure and having dopants of a second conductivity-type incorporated therein, the second conductivity-type different from the first conductivity-type;
a nitride layer on the silicon fin structure;
an oxide layer on the nitride layer; and
a gate electrode layer on the oxide layer.

* * * * *